(12) United States Patent
Nkwawo et al.

(10) Patent No.: US 10,547,022 B2
(45) Date of Patent: Jan. 28, 2020

(54) MICRO ORGANIC OPTO-ELECTRONIC DEVICE CONFIGURED FOR HIGH CURRENT DENSITY

(71) Applicants: Univ Paris XIII Paris-Nord Villetaneuse, Villetaneuse (FR); Centre National de la Recherche Scientifique (CNRS), Paris (FR)

(72) Inventors: Homere Nkwawo, Groslay (FR); Alexis Fischer, Bessancourt (FR); Alex Chamberlain Chime, Bois Colombes (CM); Lei Zeng, Carriéres-sur-Seine (FR); Min Lee, Franconville (FR); Mahmoud Chakaroun, Deuil la Barre (FR); Azzedine Boudrouia, Soisy sous Montmorency (FR)

(73) Assignees: Univ Paris XIII Paris-Nord Villetaneuse (FR); Centre National de La Recherche Scientifique (CNRS) (FR)

( * ) Notice: Subject to any disclaimer, the term of this patent is extended or adjusted under 35 U.S.C. 154(b) by 0 days.

(21) Appl. No.: 16/144,429

(22) Filed: Sep. 27, 2018

(65) Prior Publication Data

US 2019/0097164 A1    Mar. 28, 2019

(30) Foreign Application Priority Data

Sep. 28, 2017    (EP) .................................... 17306293

(51) Int. Cl.
*H01L 51/00*    (2006.01)
*H01L 51/52*    (2006.01)
(Continued)

(52) U.S. Cl.
CPC ...... *H01L 51/5206* (2013.01); *H01L 51/0096* (2013.01); *H01L 51/442* (2013.01); *H01L 51/5012* (2013.01); *H01L 51/5221* (2013.01)

(58) Field of Classification Search
CPC ............. H01L 51/0059; H01L 51/0096; H01L 51/442; H01L 51/5012; H01L 51/5206;
(Continued)

(56) References Cited

U.S. PATENT DOCUMENTS

| | | | | |
|---|---|---|---|---|
| 2015/0008412 A1* | 1/2015 | Chery | ................. | H01L 51/5203 257/40 |
| 2016/0079326 A1* | 3/2016 | Chang | ................. | H01L 27/3248 257/40 |

(Continued)

OTHER PUBLICATIONS

Barlow, et al., "High-speed Electroluminiescence Modulation of a Conjugated-Polymer Light Emitting Diode", Applied Physics Letters, vol. 94, No. 24, Jun. 2009, 3 pages.

(Continued)

*Primary Examiner* — Jaehwan Oh
(74) *Attorney, Agent, or Firm* — Lerner, David, Littenberg, Krumholz & Mentlik, LLP

(57) ABSTRACT

The invention relates to a micro Organic Opto-electronic device comprising a dielectric substrate (61, 131) and superposed on the dielectric substrate (61, 131):
a first planar electrode (62) with a first extremity (65c);
an organic layer stack (67), at least partially covering the first extremity;
a second planar electrode (63) covering partially said first extremity (65c) and said organic layer stack (67) with a part, defining an active area (64);
wherein the position and the geometry of the first extremity (65c) is configured so that the first extremity (65c) delimits a hollow zone (66) without conductive material, with an arch (65) surrounding the hollow zone (66), the arch (65) having (Continued)

two arms (65a) and a branch (65b) connecting the two arms (65a), the active area (64) been limited by the transversal dimension (Wb) of the said branch (65b) and the transversal dimension (W) of the part of the other extremity (63a).

20 Claims, 18 Drawing Sheets

(51) Int. Cl.
*H01L 51/44* (2006.01)
*H01L 51/50* (2006.01)

(58) Field of Classification Search
CPC ............ H01L 51/5209; H01L 51/5221; H01L 51/5225
See application file for complete search history.

(56) References Cited

U.S. PATENT DOCUMENTS

2019/0097163 A1\* 3/2019 Nkwawo ............ H01L 51/0096
2019/0267575 A1\* 8/2019 Liu ..................... H01L 51/5284

OTHER PUBLICATIONS

Extended European Search Report for EP Application No. 17306293, dated Mar. 14, 2018.
Wang, et al., "Fast Pulsed Electroluminescence from Polymer Light-Emitting Diodes", Journal of Applied Physics, vol. 91, No. 4, Feb. 2002, pp. 2417-2422.
Zeng, et al., "Electrical and Optical Impulse Response of High-Speed Micro-OLEDs Under UltraShort Pulse Excitation", IEEE Transactions on Electron Devices, vol. 64, No. 7, Jul. 2017, pp. 2942-2948.

\* cited by examiner

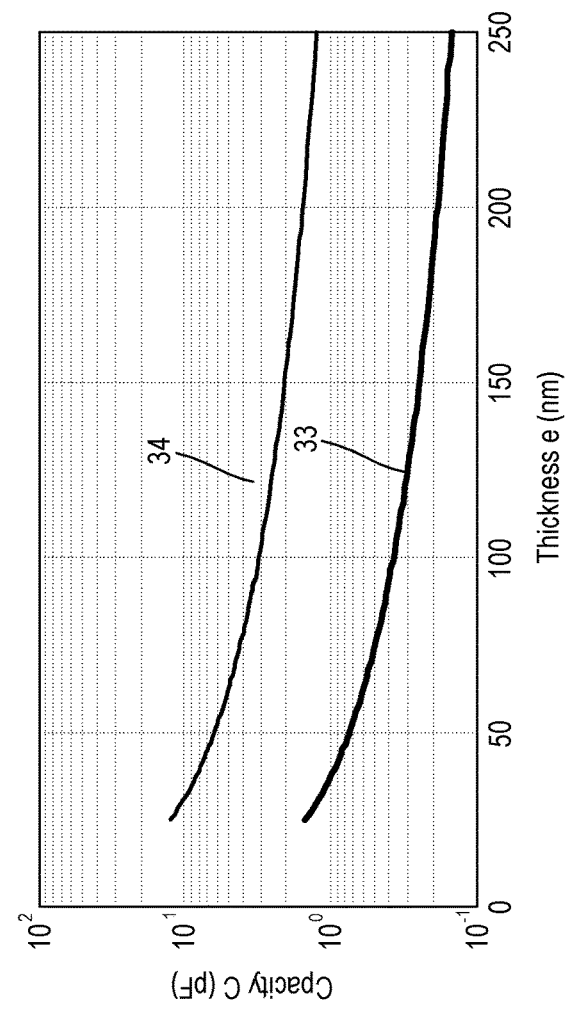
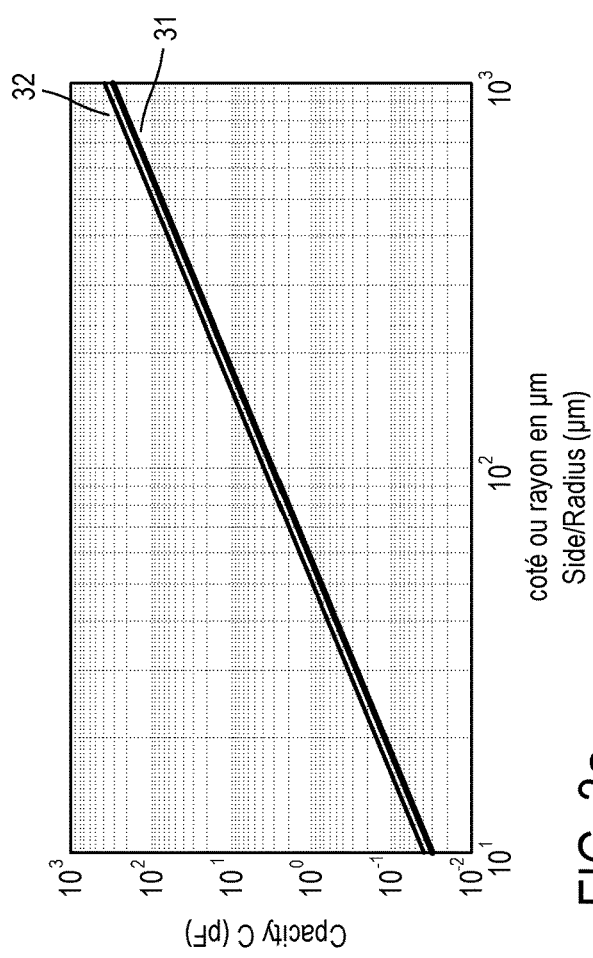
FIG. 3a
FIG. 3b

MICRO ORGANIC OPTO-ELECTRONIC DEVICE CONFIGURED FOR HIGH CURRENT DENSITY

CROSS REFERENCE TO RELATED APPLICATIONS

The present application claims priority from European Patent Application 17306293.6 filed on Sep. 28, 2017, the disclosure of which is hereby incorporated herein by reference.

FIELD OF THE INVENTION

The invention is in the field of micro-electronic and opto-electronic.

The invention presents a fast micro Organic electronic/opto-electronic device configured for high density current.

In particular, these devices can have a time response below 10 ns, in response to an electrical pulse having a duration time below 100 ns, advantageously below 10 ns.

In one embodiment shown on the drawings, the invention relates precisely to a micro Organic Opto-electronic device emitting a light impulse in response to an electrical impulse.

STATE OF THE ART

Conventional (or inorganic) electronics use semiconductor crystals that require complex and expensive manufacturing processes, colossal infrastructure (clean room) with dangerous and even lethal chemicals (As) and very high temperatures, with a relatively long manufacturing time (a few months).

In contrast to the inorganic semiconductor technology, organic electronics, the newest branch (Nobel Prize in Chemistry 2000, Alan J. Heeger, Alan MacDiarmid, Hideki Shirakawa), mainly uses plastics (polymeric or small organic compounds molecules). With relatively simple, fast (more environmentally friendly), economical production processes and almost unlimited availability of raw material, organic semiconductors are emerging as the key materials in low cost electronic. They find their applications in components such as organic light-emitting diodes (OLEDs), organic photovoltaic (PV) cells, organic transistors (OFETs), memories or sensors.

This electronics industry has developed unprecedented in recent years with the mature and commercialization of the first components. They are found as display devices on televisions and mobile phones or as lighting and signaling device . . .

Although the main applications of organic opto-electronics are now limited to lighting, display and photovoltaic cells, they could apply to the field of optical transmissions with Li-Fi, backplanes or optical telecommunications, if sufficiently fast components (fast organic opto-electronics) can be developed and can operate efficiently in an impulse operating regime.

The general context of the discussed applications is the field of electrical excitation in the range of ultra-short pulses of the order of nanoseconds and possibly high current density of organic opto-electronic components and more particularly of organic light-emitting diodes of micrometric size (micro OLED). OLED miniaturization is an important parameter of the speed/band pass of the component. Such short times require a small response time, a large bandwidth and an impedance matching an excitation circuit so that the electrical energy contained in the pulse is effectively transmitted to the organic opto-electronic component and not reflected.

As shown in the following bibliographic table, the state of the art does not offer organic opto-electronic devices obtaining for ultra-short pulses of the order of nanoseconds and high current density, a response time efficient in an impulse operating regime.

| Article number | [1]: Phys Rev. B. 84, 11,(2011) | [2]: Appl. Phys/ Lett/, 106, 9, (2015) | [3]: Jpn. J. Appl. Phys. 44 3659 (2005) | [4]: Phys/ Review B,79, 7, (2009) | [5]: J. Appl. Phys. 91, 4, (2002) |
|---|---|---|---|---|---|
| Date | 2011 | 2015 | 2005 | 2000 | 2002 |
| Authors/ Team | Karl LEO/DRE SDE | Adachi | Nakanotani | Forest | Heeger |
| Current Density | 800 A/cm$^2$ | 2.8 kA/cm2 | 1163 A/cm2 | 40 A/cm2 | 10 A/cm2 |
| Electroluminescence | | | 18 E6Cd/m2 | | 0.26 E6Cd/cm2 |
| Pulse duration | 50 ns | 5 µs | 5 µs | 700 ns | 1 µs |
| Rise time | 10 ns | 23 ns | 0.5 n or 4 ns | | 9 ns |

Thus, there is a need to improve the prior art to bridge the gap between current state-of-the-art OLEDs and discussed applications, to offer devices with the high-speed and high-current density characteristics required.

This implies to identify and optimize the dominant parameters/elements behavior inherent to the structure and to the manufacturing process that limit the time response of micro Organic Opto-electronic devices.

PRESENTATION OF THE INVENTION

Micro Organic Opto-Electronic Device

The invention is aimed at achieving the conditions for producing fast opto-electronic components, by optimizing the geometry and structure, in order to achieve a fast and high voltage pulse excitation of a micro Organic Opto-electronic device to reach high current densities while avoiding the device failure (as high-speed/ultra-short pulsed excitation with low repetition rates prevents thermal failure resulting from high-current density).

For this purpose, the subject of the invention is a micro Organic Opto-Electronic device (µ-OLED) according to claim 1.

Advantageously, but optionally, the micro Organic Opto-Electronic device according to the invention may further comprise at least one of the following characteristics:
- the hollow zone is configured: to minimize a junction capacitance of the active area by reducing the surface of the active area; to minimize a resistance serie $R_s$ of the first planar electrode; and to cope with a margin of error of the lateral positioning and the longitudinal positioning of the part of the other extremity of the second planar electrode in regard to the first extremity of the first electrode;
- the transversal dimension of the branch is greater than or equal to the margin error of lateral positioning of the part of the extremity, the longitudinal dimension of the hollow zone is greater than or equal to the margin error of the longitudinal positioning of the part of the extremity;
- electrical characteristics of the said device are modeled with:
  - a resistance Rs in series with a diode D which is in series with a resistance $R_D$, or by
  - a resistance Rs in series with a dynamic resistance $R_D'$, and
  - at least one junction capacitance in parallel with the diode D and the resistance $R_D$, or in parallel with the dynamic resistance $R_D'$, for modelling the active area, wherein the hollow zone (66) is configured to minimize the junction capacitance by reducing the surface of the active area.
- the said device is configured to minimize the serial resistance Rs, wherein the first planar electrode comprises a metallization layer on its area of the first extremity except on the active area.
- the longitudinal dimension of the branch is between 2 µm and 20 mm; the longitudinal dimension of the hollow zone is between 2 µm and 20 mm; the transversal dimension of the part of extremity is between 1 µm and 10 mm, the transversal dimension of said branch is between 1 µm and 10 mm, and the transversal dimension of the arms are between 1 µm and 1 mm;
- the junction capacitance of the active area is less than 200 pF, preferably less than 20 pF and more preferably less than 1 pF;
- the equivalent resistivity of the active area is less than 500 Ohms, preferably less than 50 Ohms, and more preferably less than 1 Ohm;
- the first planar electrode and/or the second planar electrode presents a transparent and conductive layer or a metallic layer;
- the part of the first extremity is rectilinear, and is perpendicular to the branch;
- the Opto-Electronic device is an OLED or an organic photodiode.
- the hollow zone present rounded inner corners;
- the first planar electrode and/or the second planar electrode presents a conductive and transparent oxide layer or a metallic layer, configured for letting the light pass through or for waveguiding of light;
- the first planar electrode comprises a metallization layer on the area of the first extremity except on the active area;
- the first planar electrode is the cathode formed in an ITO (indium Tin Oxide) layer, and the second planar electrode is the anode and presents a metallic layer;
- the organic layer stack is an M-mtDATA type material;
- the thickness of the organic layer stack is between 50 nm, more preferably and 200 nm;
- the active area has a maximum dimension less than 500×500 µm², preferably less than 200×200 µm², more preferably less than 100 µm² and even more preferably less than 20 µm².

Such micro Organic Opto-Electronic device allows optimizing the µ-OLED and improving the electrical time constant by:
- the reduction of parasitic capacitances. That is typically achieved by reduction of the active surface area of the OLED.
- the minimization of serial resistance $R_s$ (and the dynamic resistance $R_D'$).

Such micro Organic Opto-Electronic device allows optimizing the µ-OLED and improving the electrical time constant by:
- the effective speed propagation of the pulse in the electrodes such as there is no rupture with the rest of an excitation circuit.

Consequently, it advantageously allows conceiving low cost and fast time-to-market/simpler Opto-Electronic device.

Other features can be considered:
- the micro Organic Opto-Electronic device is configured to have a time response below 10 ns, in response to an electrical impulse having a pulse duration time below 100 ns;
- the dielectric substrate supports at least one ground plane, some electrical wires for the voltage supply connected to the first planar electrode and to the second planar electrode; the first planar electrode, the second planar electrode and the ground plane are separated by gaps without conductive material, the gaps having a size so as to adapt the speed of propagation of the electrical pulse in the device for limiting the reflections due to the passage of the electrical impulse between electrical wire and the planar electrode; the gaps have a size so that an effective dielectric permittivity of the micro Organic Opto-Electronic device equal to the dielectric permittivity of the electrical wire delivering the electrical impulse (plus or minus 10%);
- the first planar electrode, the second planar electrode and the ground plane are structured (for instance by etching) to integrate an excitation or a characterization circuit, including at least a resistance, capacitance and/or inductance;
- the resistance, capacity and/or inductance, are disposed in series/parallel;
- the first planar electrode extends between two ground planes on the same side of the substrate, at equal distance of the two ground planes, and is separated from the two ground planes with some gaps without conductive material, wherein the transversal dimension T of the first planar electrode and the transversal dimension G of the gap between said first planar electrode and each of the two ground planes are such that the effective dielectric permittivity $\varepsilon_r$ effective defined by: $1+(\varepsilon_r-1)/2*\beta(\gamma_2)\beta(\gamma_1)$ is equal to $\varepsilon_{r0}$ the dielectric permittivity of the electrical wire; where:

$\varepsilon_r$ is the dielectric permittivity of the dielectric substrate, $\gamma_1$, $\gamma_2$ and $\gamma_3$ are geometrical parameters, $$\gamma_3 = \sqrt{(1-\gamma_1^2)};$$

-continued $$\gamma_1 = T/(T+2G);$$

$$\gamma_2 = \frac{\sinh\left(\pi\frac{T}{4h}\right)}{\sinh\left(\pi\frac{T+2G}{4h}\right)};$$

$$\beta_1(\gamma) = \frac{\pi}{\ln\left(2\frac{1+\sqrt{\gamma_3}}{1-\sqrt{\gamma_3}}\right)}$$

defining $\beta(\gamma)$ for $\gamma_1$ and $\gamma_2$ in the interval $0<\gamma<1/\sqrt{(2)}$;

$$\beta_2(\gamma) = \frac{\ln\left(2\frac{1+\sqrt{\gamma}}{1-\sqrt{\gamma}}\right)}{\pi}$$

defining $\beta(\gamma)$ for $\gamma_1$ and $\gamma_2$ in the interval $1/\sqrt{(2)}<\gamma<1$; h being the thickness of the dielectric substrate;
  the first planar electrode/or the second planar electrode is the ground plane;
  the ground plane is on one side of the substrate, and the first planar electrode and the second planar electrode are tracks on the other side of the substrate and are electrically linked to the ground plane with vias;
  the geometry of the second planar electrode and the ground plane in regard to the first second planar electrode imply an impedance of the device equal to 50 ohms or 75 ohms;
  the first planar electrode and/or the second planar electrode presents a conductive and transparent layer or a metallic layer configured for letting the light pass through or for waveguiding of light;
  the first planar electrode is the cathode made of ITO (indium tin oxide), and the second planar electrode is the anode and presents a metallic layer;
  the second planar electrode is the cathode and is made of ITO, and the first planar electrode is the anode and presents a metallic layer;
  the dielectric substrate is glass, silicon, silicon oxide, silicon oxide on silicon, polymers or flexible substrate;
  the branch connecting the two arms comprises one or several photonic elements;
  the micro Organic Opto-Electronic device is configured to have a time response below 10 ns, in response to electrical impulse having a pulse duration time below 100 ns, so as to allow a current density in the active area superior to 3 kA/cm$^2$, preferentially 4 or 5 kA/cm$^2$.

Micro Organic Electronic Device which does not Emit Some Light

In another embodiment not shown on drawings, the invention can concern only a micro organic electronic device which cannot emit some light.

This, micro Organic electronic device, comprising a substrate, and superposed on the substrate, presents in a first variant:
  a first planar electrode with a first extremity;
  an organic layer stack at least partially covering the first extremity;
  a second planar electrode with another extremity covering partially said organic layer stack and said first extremity with a part, defining an active area of the Organic Electronic device;
  wherein the position and the geometry of the first extremity is configured so that the first extremity comprises a hollow zone without conductive material and an arch surrounding the hollow zone, the arch having two arms and a branch connecting the two arms, the active area been limited by the transversal dimension of the said branch and the transversal dimension of the part of the extremity, the hollow zone being configured to:
  minimize the junction capacitance of the active area by reducing the active area,
  minimize the resistance serie Rs of the first planar electrode, and
  cope with the imprecision of the lateral positioning and the longitudinal positioning of the extremities of the two electrodes.

Advantageously, but optionally, the micro Organic electronic device according to the invention may further comprise at least one of the following characteristics:
  the Organic Electronic device is configured to have a time response below 10 ns, in response to an electrical impulse having a pulse duration time below 100 ns, so as to allow a current density in the active area superior to 3 kA/cm2, preferentially 4 or 5 kA/cm2;
  the branch connecting the two arms may contain frequency selective optical element like distributed feedback structures (DFB), Bragg gratings, photonic crystals, micro laser cavities or other photonic elements.

In a second variant, the Micro Organic Electronic device having a time response below 10 ns, in response to electrical impulse having a pulse duration time below 100 ns, comprises a dielectric substrate which supports:
  at least one ground plane;
  a first planar electrode;
  an organic layer stack partially covering said first planar electrode;
  a second planar electrode with at least a part covering said organic layer stack and first planar electrode;
defining an active area of the Micro Organic Electronic device;
  some electrical wires for the voltage supply connected to the first planar electrode and to the second planar electrode;
wherein the first planar electrode, the second planar electrode and the ground plane are separated by gaps without conductive material so as to adapt the speed of the propagation of the electrical pulse in the device for limiting the reflections due to the passage of the electrical impulse between electrical wire and the planar electrode.

Advantageously, but optionally, the micro Organic electronic device according to the invention may further comprise at least one of the following characteristics: the first planar electrode, the second planar electrode and the ground plane are structured (by etching for instance) to integrate (or comprise) an excitation and characterization circuit, such as resistance, capacity and/or inductance.

All the features described pages 3-7 of the micro Organic Opto-electronic device can be applied to the micro Organic electronic device of the first variant and of the second variant.

BRIEF DESCRIPTION OF THE DRAWINGS

Other features, objects and advantages of the present invention will appear on reading the following detailed description, with regard to the accompanying figures, given as non-limiting examples and in which:

FIG. 3a shows schematically values of capacitance of an active area given a thickness of the said active area according to the state of the art;

FIG. 3b shows schematically values of capacitance of an active area given a thickness of the said active area according to invention;

DETAILED DESCRIPTION OF AT LEAST ONE EMBODIMENT OF THE INVENTION

Figure 1B:
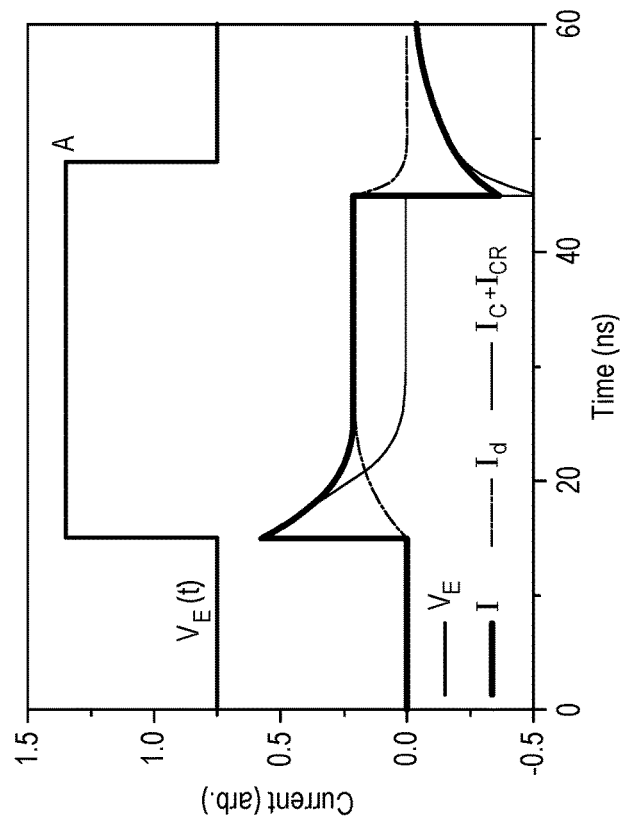
FIG. 1b shows schematically a response to an impulse of the said equivalent electrical diagram.
Figure 1A:
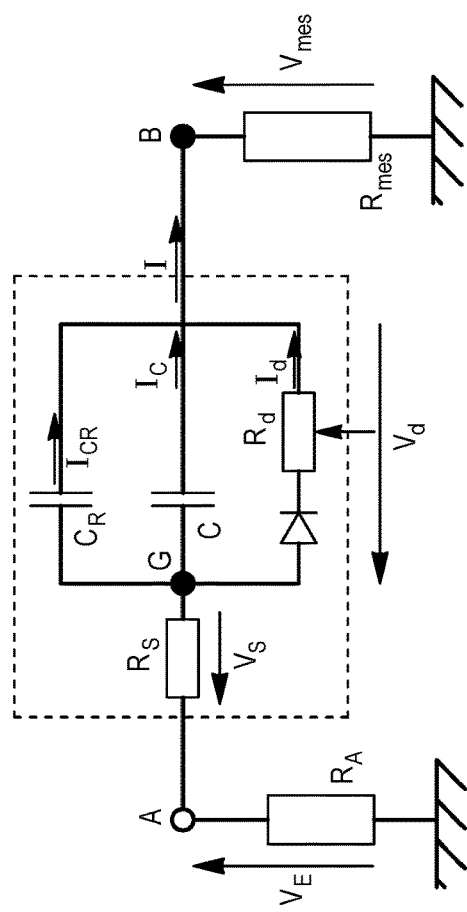
FIG. 1a shows an equivalent electrical diagram of a µ-OLED according to the state of the art.

With reference to FIG. 1a, there is shown schematically an equivalent electrical schema for modeling a micro Organic Opto-Electronic device (µ-OLED). The µ-OLED equivalent circuit is modeled with:
- a serial resistance $R_S$ taking into account the electrodes geometry;
- a dynamic resistance $R_D'$ (or an ideal diode D in series with a resistance $R_D$); and
- a capacitance C in parallel, and possibly, with another capacitance $C_R$. The capacitance C is the junction capacitance, while $C_R$ models the parasitic capacitance resulting from the fabrication process.

$V_{mes}$ is the voltage across the resistance $R_{mes}$, and $V_E$ is the excitation voltage.

The current I flowing through $R_{mes}$ is the sum of $I_D$, $I_C$, and $I_{CR}$, which are the currents flowing through the diode D and $R_D$, the junction capacitor C, and the fabrication process capacitor $C_R$, respectively.

The currents $I_C$ and $I_{CR}$ appear during the transient regime then vanish after the decay time $\tau$ (95% decay after $3\tau$).

Therefore, the relevant current flowing through the µ-OLED must be measured once the steady state is established after three times the time response ($3\tau$). In other words, the capacitances are charged first which produces the peak current followed by a decay in current that allow the current through the active part of the µ-OLED to flows progressively.

If the pulse transversal dimension is too short and ends before the capacitance current vanishes, the current flowing through the organic diode remains negligible and the latter hardly lights-up. Therefore, there is a minimum pulse duration for a µ-OLED to operate efficiently with significant light emission because of the transient regime described above. In order to be able to excite an OLED with an ultra-short pulse and to reduce the transient regime duration, the time response $\tau$ of the OLED has to be minimized.

Simulation results of this equivalent model in the presence of a pulse excitation are shown in FIG. 1b.

For a pulse excitation with amplitude A, the voltage across $R_{mes}$ exhibits a sharp rise reaching a current peak followed by an exponential decay to a steady state current value.

The peak of current is the result of an $I_C+I_{CR}$ current flowing through the capacitors and short-circuiting the diode. The current Id actually passing through the light emitting zone increases as the current charging the capacitors is switched off (load saturation).

The electrical time constant, which characterizes the "duration" of the transient regime, is typically the result of a product $T_e = R_{eq} \times C_{eq}$.

A more detailed expression is:

$$T_{e'} = \frac{C}{\frac{1}{R_d} + \frac{1}{R_s + R_{mes}}}$$

with $C_{eq} = C + C_R$ and $$R_{eq} = \frac{1}{\frac{1}{R_d} + \frac{1}{R_s + R_{mes}}}.$$

The time constant $T_{e'}$ corresponding to the speed of charge of the capacitors is therefore limited by $R_S$, $R_D$, C, $C_R$ (and $R_{mes}$ when there is one). The electrical time constant is thus accessible by the geometry and structure of the µ-OLED.

By optimizing the geometry and structure, mainly from the electrical and physical point of view to reduce $R_D$, $R_S$, C and $C_R$ when it exists. It is therefore a question of optimizing the component including its electrodes, so that the very short electrical pulses are effectively applied to the organic hetero-structure without reflection and with a minimized Joule effect so that the energy contained in each pulse contributes effectively to the emission of a light pulse.

Thus, the following sections are addressed to optimize the µ-OLED and improve the electrical time constant by:

1. The reduction of capacitances C (and $C_R$ when it exists) are reduced. That is typically achieved by reduction of the active surface area of the OLED.
2. The minimization of serial resistance $R_S$ (and the resistance $R_D$ or $R_D'$) (reduction of the resistive effect related to the geometry of the electrodes).
3. The effective speed propagation of the pulse in the electrode, such as it does not show rupture with the rest of an excitation circuit.

1. Capacitance Issue

Organic materials are closer to dielectrics than semiconductors. Thus, when these materials are positioned between two electrodes, they constitute a capacitor.

Figure 2B:
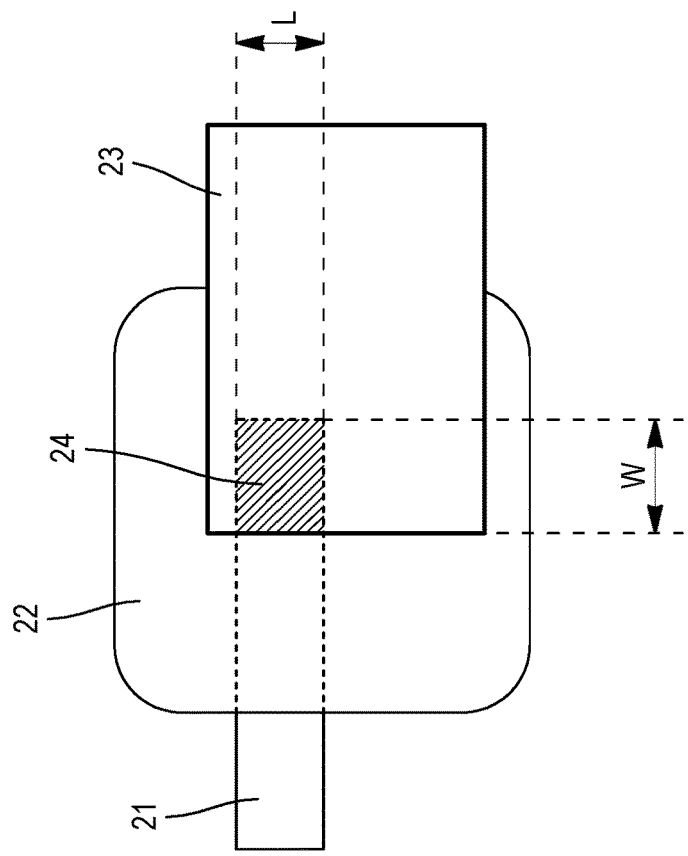
FIGS. 2a and 2b show schematically an active area of a µ-OLED according to the state of the art.
Figure 2A:
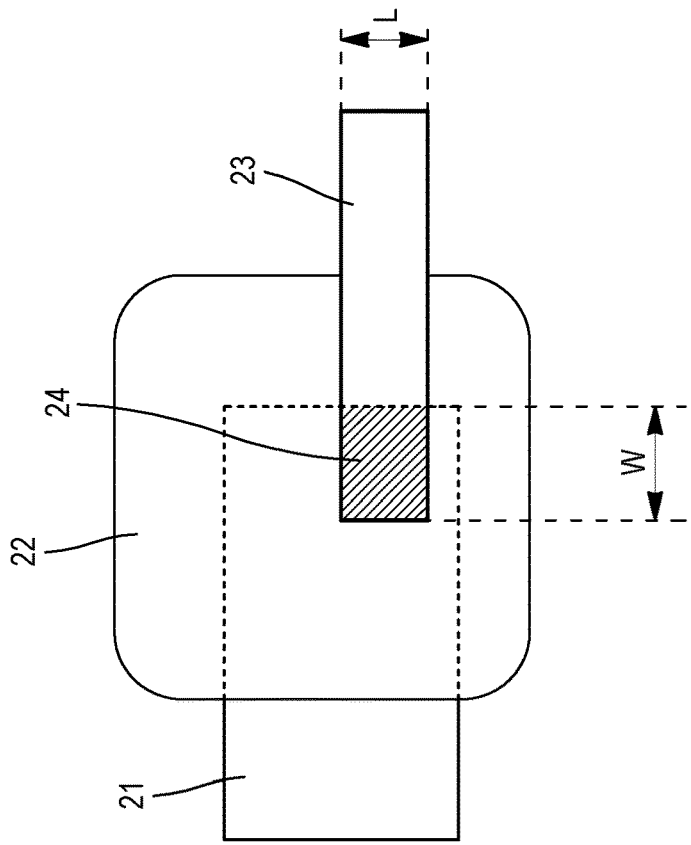

FIGS. 2a and 2b illustrates different geometries of overlapping of organic semiconductors 22, an anode 21 and a cathode 23, defining an active area 24.

The anode 21 and cathode 23 may contain preferentially ITO or aluminum.

For a µ-OLED with organic semiconductors of mean relative dielectric constant $\varepsilon_r \approx 3.5$ and surface area S=L×W, the junction capacitance is: $C = \varepsilon_r * \varepsilon_0 * (S/e)$ wherein L and W are the longitudinal dimensions and transversal dimensions, where e is the thickness of the stacks of various materials that constitute the organic hetero-structure between the anode and the anode.

The said equation shows that the capacitance increases with the active surface.

A typical junction capacitance value is about 20-40 $nF/cm^2$.

FIG. 3a shows the curves of capacitance value in pico-Farad (pF) of the active area of square 32 and circular µ-OLED 31 as a function of the side (L or W), Thus, as illustrated, the capacitance increased linearly with the value of the side (L or W).

The thickness e of a typical µ-OLED is preferentially between about 80 nm and 100 nm.

The state of the art is to reduce the thickness of the organic hetero-structure to compensate for the low mobility of the charges of organic semiconductors.

On the contrary, increasing the thickness makes it possible to minimize the capacitance as shown in FIG. 3b, wherein it illustrates the evolution of the capacitance as a function of the thickness of the organic hetero-structure for an active surface of 100 µm×100 µm (ref. 34) and for 12 µm×100 µm (ref. 32).

Moreover, to optimize the time constant, we can make thicker organic hetero-structures using the material m-Mt-DATA (4,4',4"-Tris[(3-methylphenyl) phenylamino]triphenylamine) which exhibits much greater mobility than other semiconductors organic.

Thus, optimized capacitance can be obtained preferentially for a thickness between about 125 nm and 180 nm, which allows a reduction of a factor of about 2.25 compared to the standard µ-OLED.

As seen previously with the equation of the junction capacitance, it is possible to precisely controlling the latter by limiting the zone of superposition of the cathode and the anode (active area), as the capacitance increases with the active surface.

It is therefore possible to reduce the active area S of a µ-OLED by reducing the size of one of the electrodes to a transversal dimension L, and superimposing the two electrodes with a distance W. The active surface is then S=W×L.

The delimitation of the active surface area of the µ-OLED can be carried out in two ways different (present in the literature):

By photolithography: this method introduces a parasitic capacitance which does not bring benefits to the reduction of the active surface.

Figure 4:
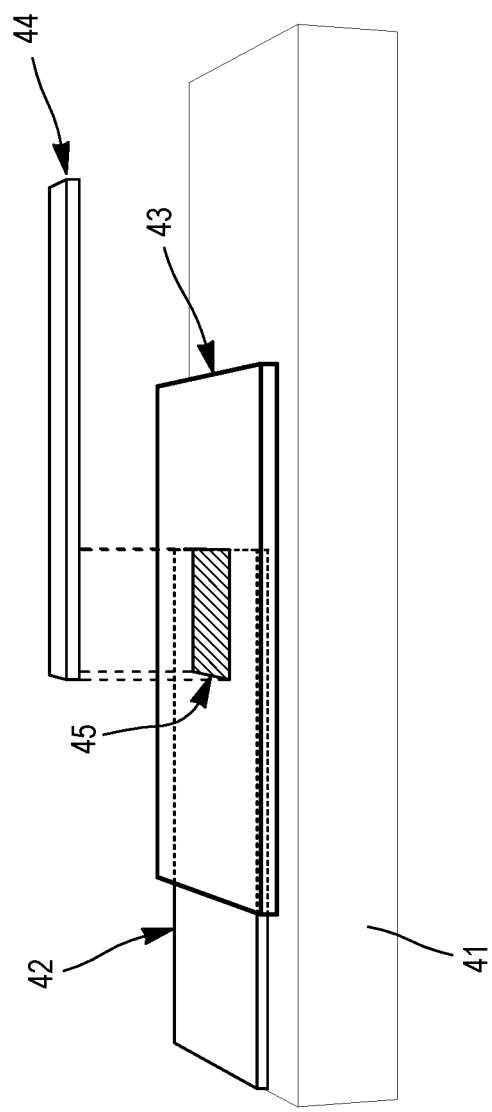
FIGS. 4, 5a to 5d show schematically the positioning of electrodes of an OLED according to the state of the art.

By delimitation by the superposition of the electrodes (ref. 42, 44): the principle is illustrated in FIG. 4. On a substrate 41 the cathode 42 is structured before depositing the organic layers 43 in vacuum, and after the anode 44. The deposition of an aluminum layer in a strip thin film is made possible by evaporation through a masking mask (hollow mask).

To successfully delimit µ-OLED by superposition for obtaining the active area 45, the precision of the positioning of the cache mask is crucial. This positioning must be done during evaporation under vacuum by a precision mechanical system. In practice, it is difficult to conceive the alignment of masks with masks better than +/−0.5 mm and the smallest holes can hardly be less than 100 µm. In addition, conical projection effects during evaporation may lead to a widening of the pattern of a factor of 2. In the area of µ-OLED display, the resolution of hollow-mask allows realizing pixels of a typical size of 300 µm.

It should be noted that the structuring steps are only possible before the filing of the organic layers because they are fragile and sensitive to any chemical contact. It is therefore easier to micro-nano structure the anode than the cathode. The latter can only be delimited "grossly" by evaporation through a hollow mask.

The cone of projections through this mask introduces uncertainties on the transversal dimension and lateral positioning ΔL and longitudinal ΔW of the cathode as illustrated in FIGS. 5a, 5b, 5c and 5d.

Figure 5A:
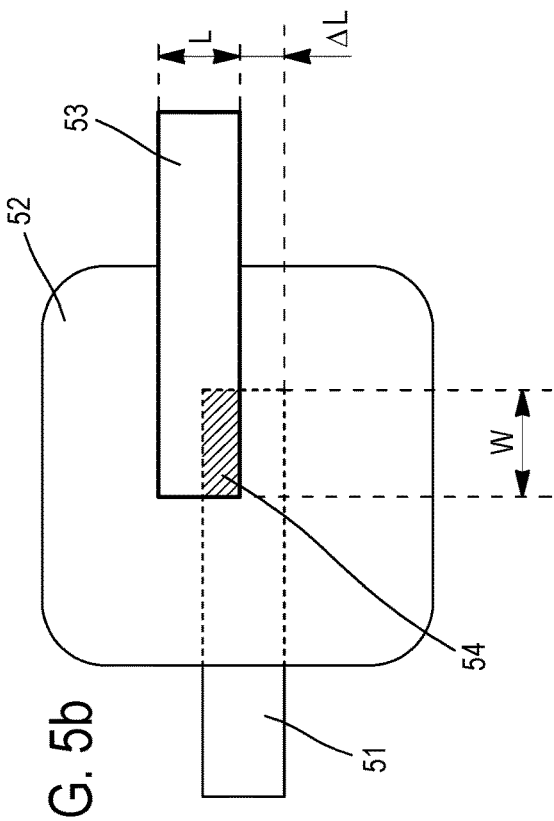
Figure 5B:
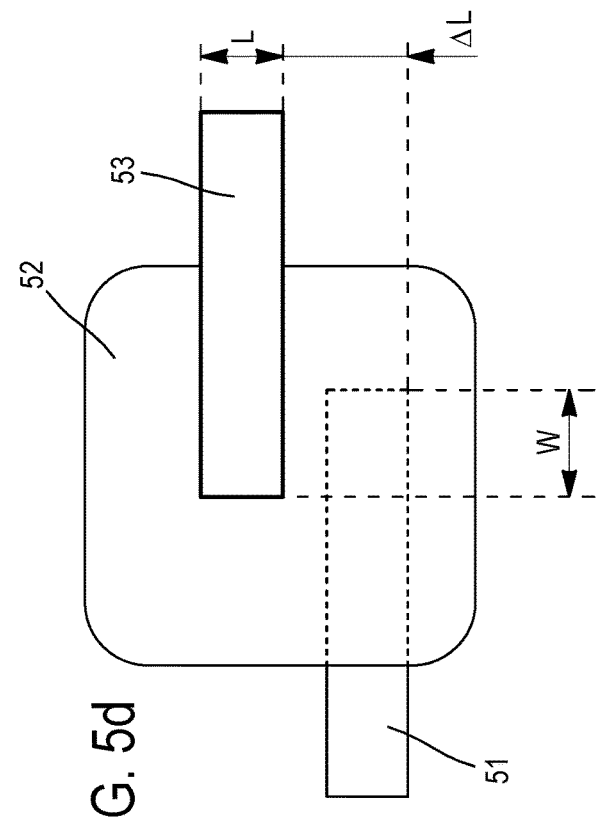
Figure 5C:
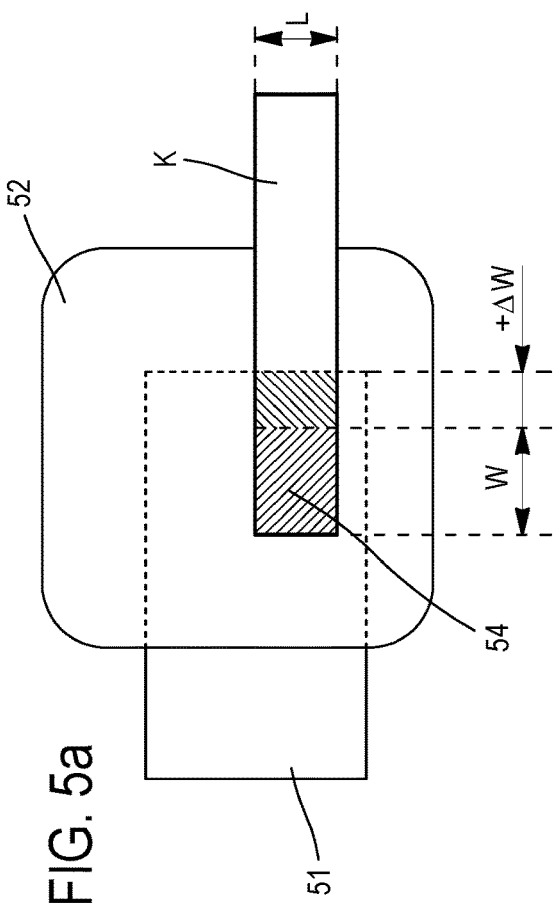
Figure 5D:
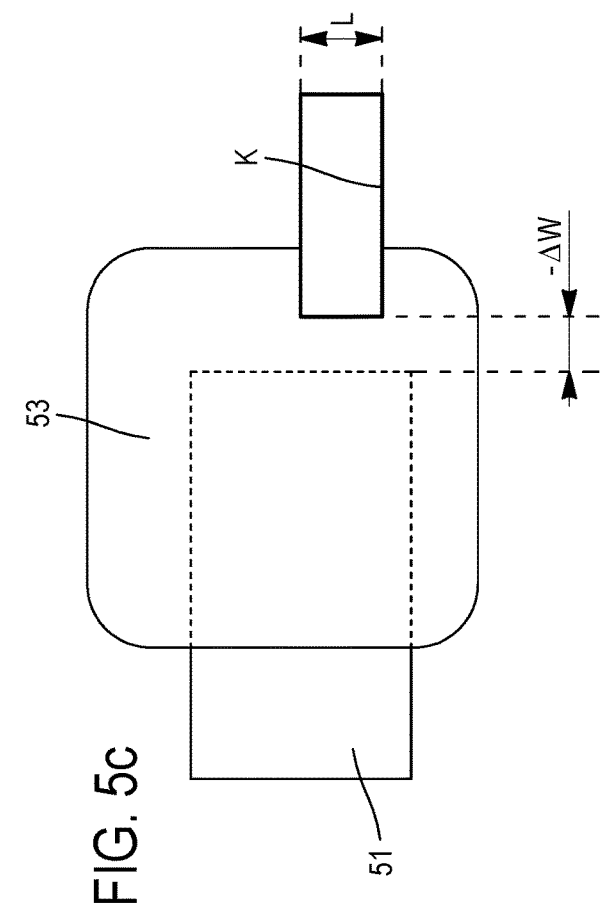

For rectangular geometries, the surfaces defined by the dimensions of the electrodes (51, 53) are in practice subjected to positioning problems and uncertainties that have a significant impact on the active area 54 according to the sign of the positioning error:

the active surface 54 is defined by the transversal dimension L of the narrowest electrode (51, 53), and the covering W of the anode 51 and of the cathode 53. Where positioning is with a longitudinal uncertainty+ ΔW the active area 54 increases to S=(W+ΔW)×L (FIG. 5a);

if the positioning uncertainty is negative (−ΔW) the active area is null (FIG. 5c);

when positioning results in transversal positioning uncertainty ΔL the active area 54 increases: S=W×(L−ΔL) (FIG. 5b); and if the transversal positioning uncertainty ΔL>L then the active area is null (FIG. 5d).

Figure 6A:
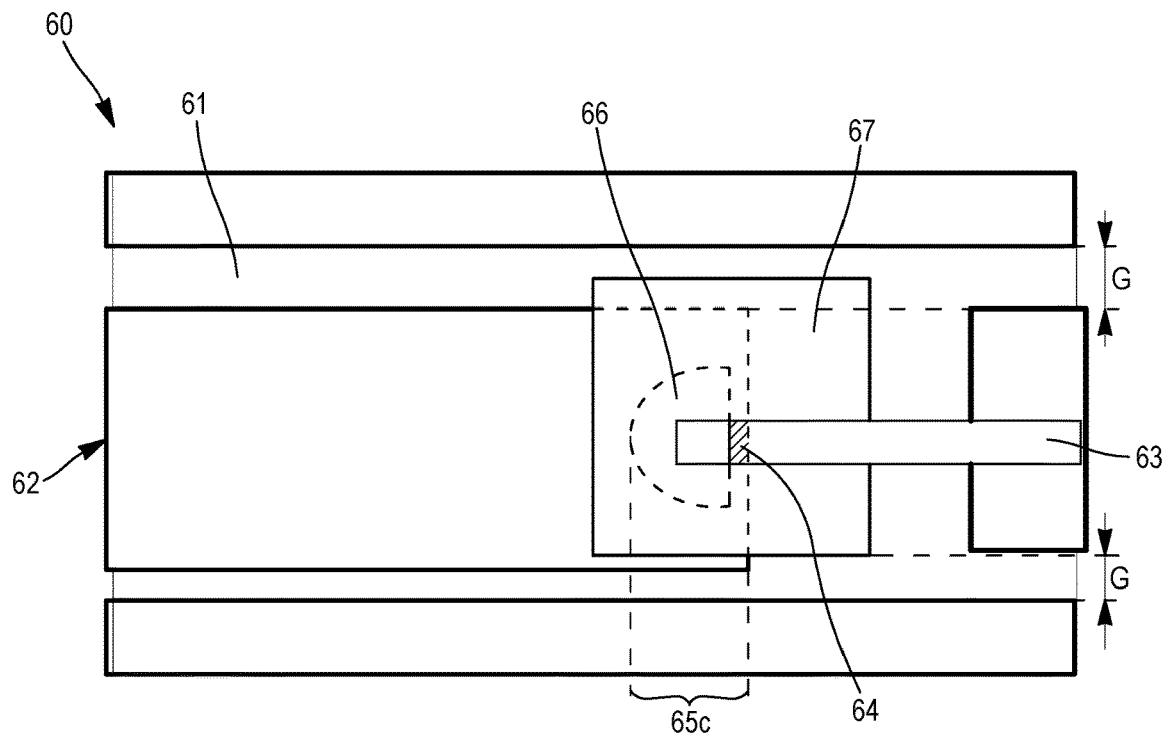
FIGS. 6a, 7a, 7b show schematically the positioning of electrodes of a µ-OLED according to the invention.

FIG. 6a illustrates an embodiment of a µ-OLED 60 that allows achieving smaller dimensions and reducing the influence of errors of positioning.

Figure 6B:
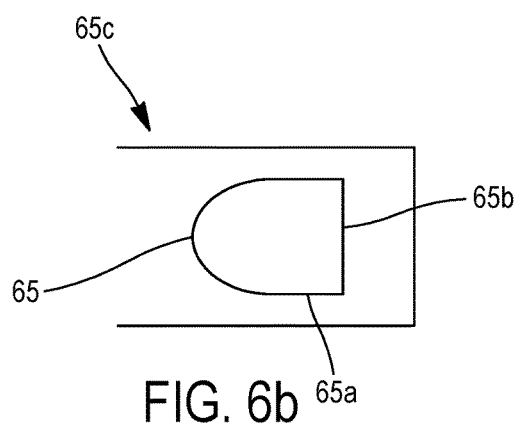
FIGS. 6b, 6c, 6d and 6e show schematically details of electrodes of a µ-OLED according to the invention.
Figure 6C:
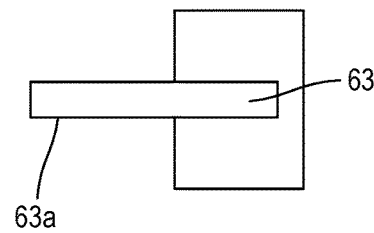
Figure 6D:
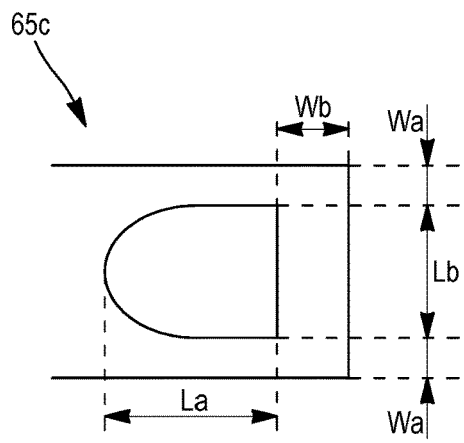

The µ-OLED 60 comprises a substrate and superposed on the substrate 61, 131:

a first planar electrode 62, preferentially a cathode, with a first extremity 65c;

organic layers stack 67 comprising at least one layer of electroluminescent material, at least partially covering the first extremity, wherein the thickness of the organic layers stack is between 50 nm, more preferably and 200 nm;

a second planar electrode 63, preferentially an anode, with another extremity 63a (as illustrated in FIG. 6c) covering partially said first extremity 65c and said organic layer stack 67 with a part, defining an active area 64 of the micro-OLED 60.

The first planar electrode 62 and/or the second planar electrode 63 presents a transparent and conductive layer, preferentially with a conductive and transparent oxide layer or a metallic layer, configured for letting the light pass through or for waveguiding of light. Preferentially, the cathode presents an ITO (indium Tin Oxide) layer, and the anode and presents a metallic layer.

At least one electrode, preferentially the cathode 62 is pre-structured with a hollowed area 66 to reduce the active area 64.

Figure 6E:
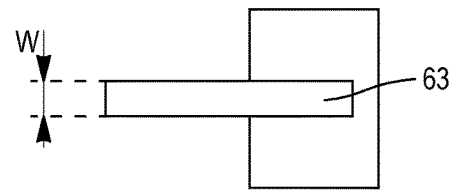

For that purpose, as illustrated in FIGS. 6b and 6c, the position and the geometry of the first extremity 65c is configured so that the first extremity 65c delimits a hollow zone 66 without conductive material, with an arch 65 surrounding the hollow zone 66, the arch 65 having two arms 65a and a branch 65b connecting the two arms 65a, the active area 64 been limited by the transversal dimension Wb of the said branch 65b and the transversal dimension W of the part of the other extremity of the anode 63 (as illustrated in FIG. 6e).

So, the cathode 62 is hollowed out in the area superimposed with the anode 63. The part of the other extremity 63 is rectilinear, and is perpendicular to the branch 65b.

The transversal dimension Wb of the branch 65b is between 2 μm and 20 mm; the longitudinal dimension Lh of the hollow zone 66 is between 2 μm and 20 mm; the transversal dimension of the part of extremity is between 1 μm and 10 mm, the transversal dimension Wb of the said branch 65b is between 1 μm and 10 mm, and the transversal dimension La of the arms 65a are between 1 μm and 1 mm.

Figure 7B:
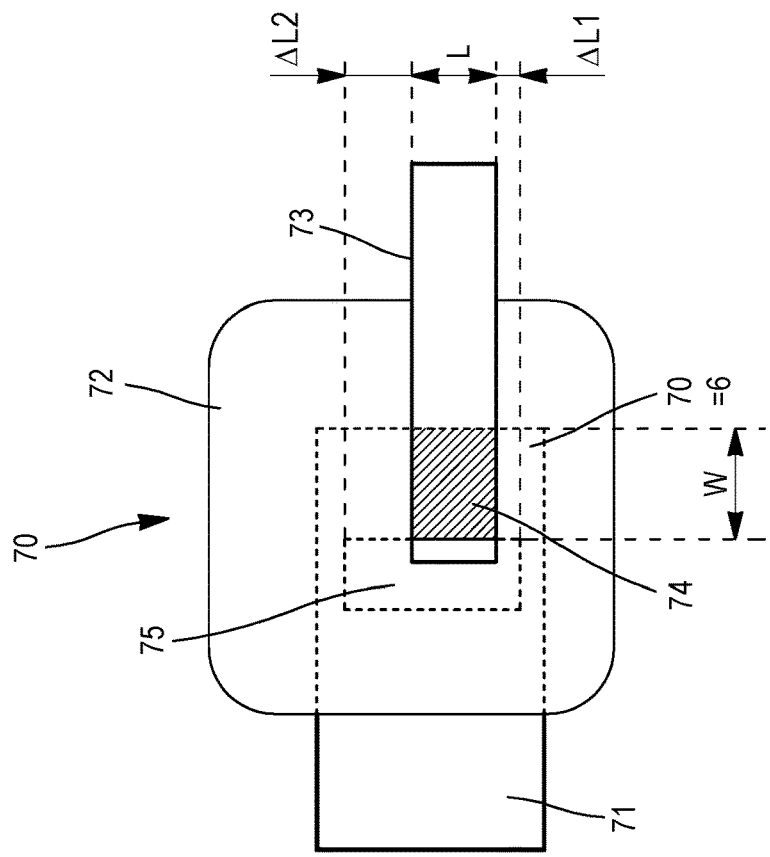
Figure 7A:
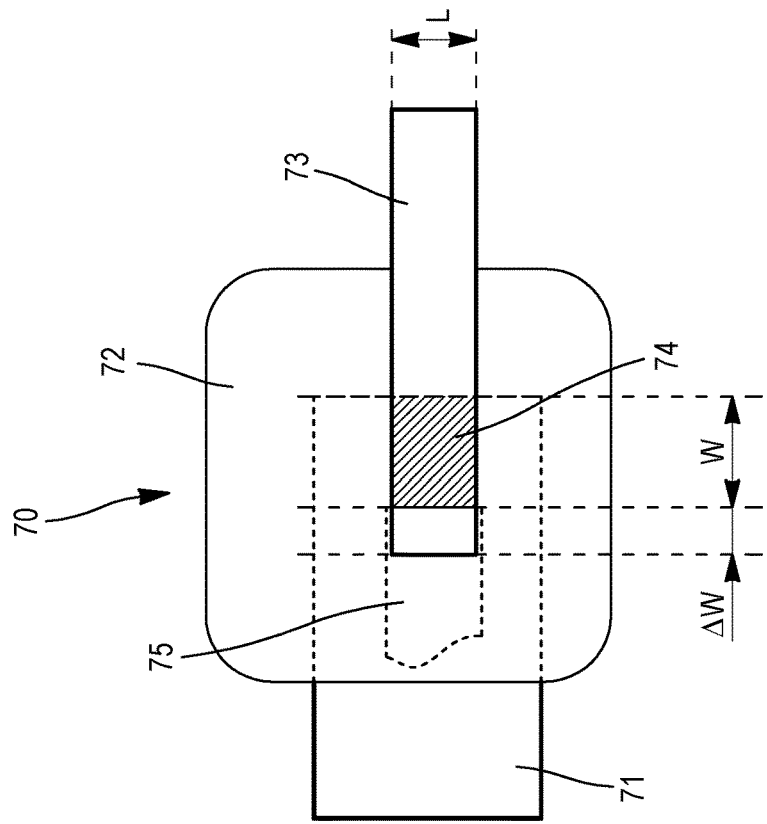

FIGS. 7a and 7b illustrate another embodiment of a μ-OLED 70.

A hollow zone 75 allows limiting one side of an active area 74 of transversal dimension W and longitudinal dimension L, whatever the longitudinal positioning error ΔW>0 (FIG. 7a). To take account of the lateral positioning error ΔL, the hollow zone 75 is expanded to L+ΔL1+ΔL2 (FIG. 7b).

Thus, the longitudinal dimension L of the branch 76 is greater than or equal to the margin error of lateral positioning ΔL of the extremity of the second electrode, the longitudinal dimension of the hollow zone is greater than or equal to the margin error of the longitudinal positioning ΔW of the extremity of the first electrode.

The geometry adopted for the anode (an arch having two arms and a branch connecting the two arms) and the positioning of the cathode allows reducing the active surface and therefore the capacitance of the μ-OLED, while minimizing the effect of increase of the contact resistance because the charges can move from one end to the other of the branch of the arch. Indeed, the contact resistance is reduced by a factor of at least two for identical electrodes transversal dimensions compared to conventional geometry, such as the one illustrated in FIGS. 8a and 8b. Electrodes 82, 83 have a crossing geometry, known in the state of the art.

Figure 8B:
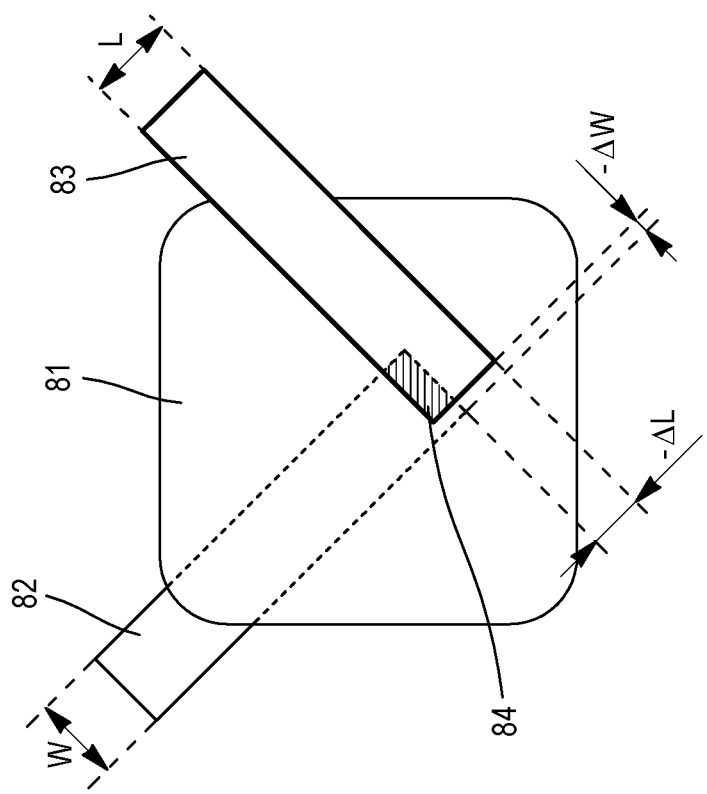
FIGS. 8a, 8b show schematically the positioning of electrodes of a µ-OLED according to the state of the art.
Figure 8A:
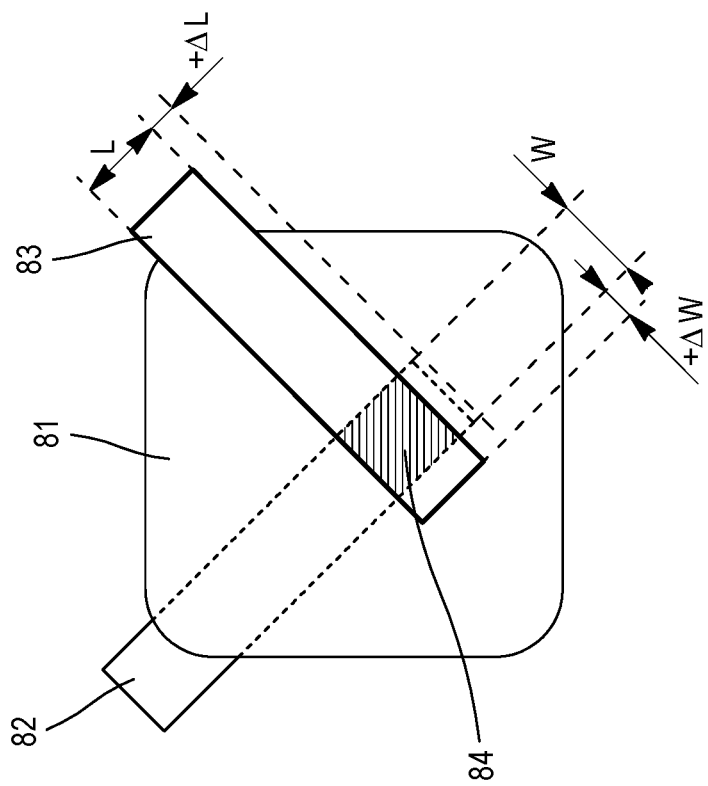

FIGS. 8a and 8b show the effect of positioning uncertainties. Thus, in this conventional geometry, the margin error of the longitudinal positioning ΔW of the extremity of a first electrode 82, and the margin error of lateral positioning ΔL of an extremity of a second electrode 83 induced great difference of the value of the active area 84. The active area 84 in FIG. 8a being greatly superior compared to the active area 84 in FIG. 8b. Thus, such configuration does not allow controlling the active area with precision. Therefore, it does not allow controlling the capacitance of the μ-OLED.

Figure 9B:
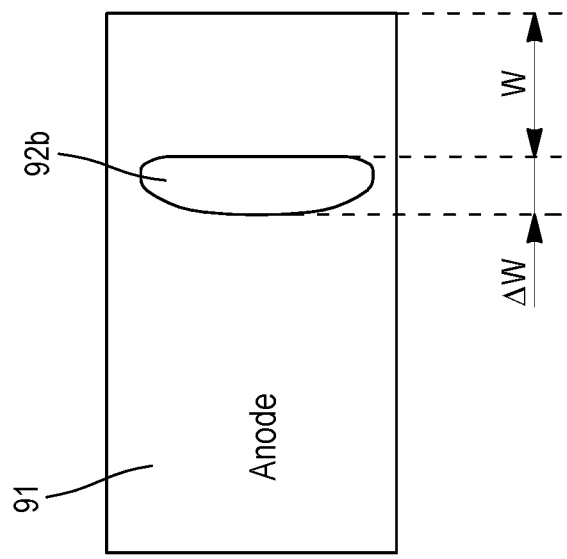
FIGS. 9a, 9b show schematically the hollow zone of an electrode of a µ-OLED according to the invention.
Figure 9A:
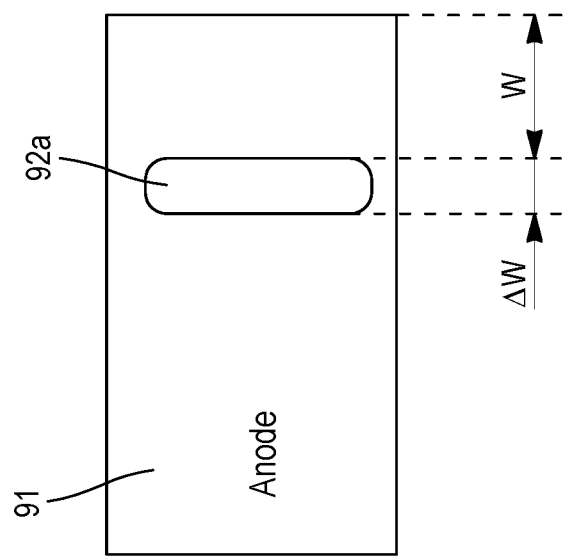

In reference to FIGS. 9a and 9b, an anode 91 includes a hollow zone 92a/92b at an extremity. The hollow zone 92a/92b has an arch geometry that can be optimized by removing all right angles in order to optimize the current lines and the passage of loads in the electrodes.

Thus, the arch can have a semicircular, elliptical, baskethandle, or right geometry.

Preferentially, an active area has a maximum dimension of less than 500×500 micrometers squared, preferably less than 200×200 micrometers squared, more preferably less than 100 micrometers squared and even more preferably less than 20 micrometers squared, with a capacitance value less or equal than about 200 pF, preferably less than 20 pF, preferably less than 1 pF, and more preferably less than 0.4 pF.

The equivalent resistivity of the active area is less than 500 Ohms, preferably less than 50 Ohms, and more preferably less than 1 Ohm.

2. Resistance Issue

There are two types of resistance models:
dynamic resistance; and
serial resistance.

The reduction of the active surface, therefore of dimensions W and L of the electrodes, can lead to an increase in the series resistance $R_S$ due to the geometry of the electrodes in addition to the reduction of the desired capacitance.

Therefore, to reduce the time constant of the organic opto-electronic component, it is essential to also reduce the serial resistance which results from the geometry of the anode and the cathode.

Moreover, if an electrode includes ITO material, as ITO is less conductive than metals (ITO conductivity is $5.95\ 10^5$ S/m versus $3.53\ 10^7$ S/m for aluminum), the series resistance of such electrode is higher to those of the inorganic opto-electronic components.

In the example of an ITO anode of transversal dimension W, longitudinal dimension $l_{ito}$, thickness $t_c$ and resistivity $\rho_{ito}$, and an aluminum cathode of longitudinal dimension $l_{al}$. Transversal dimension L and thickness $t_a$.

The total series resistance is: $R_S = R_{S-cathode} + R_{S-anode}$, sum of the anode-induced series resistance: $R_{S-anode} = \rho_{ITO}*l_{ito}/W_{tc}$, and that induced by the cathode is: $R_{S-cathode} = \rho_{Al}*l_{Al}/L_{ta}$.

It is clear that the reduction of the surface area of the μ-OLED (S=W×L) leads to an increase in the series resistance whose main contribution is the ITO anode.

Typical series resistance values obtained without metallization of at least one electrode are in the range 40-100 Ohm, for track longitudinal dimensions of 1 cm and transversal dimensions W=2 mm.

This resistance is favorably reduced by a factor of 2900 if an electrode comprising ITO is metallized by aluminum at locations other than the active area which must remain transparent, i.e. less or equal than about a few ohms or even a few fractions of ohm.

Figure 10A:
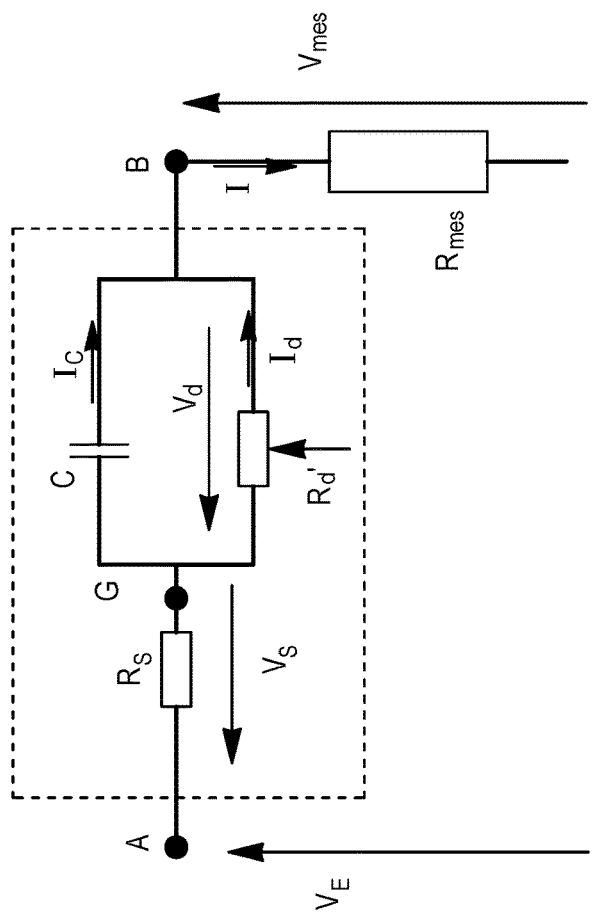
FIG. 10a shows an equivalent electrical diagram of a µ-OLED according to the invention.

FIG. 10a shows an equivalent electrical model of a μ-OLED, corresponding to FIG. 1a, wherein the diode is replaced by a dynamic resistance $R_D'$, a resistance which depends on the polarization point.

Figure 10B:
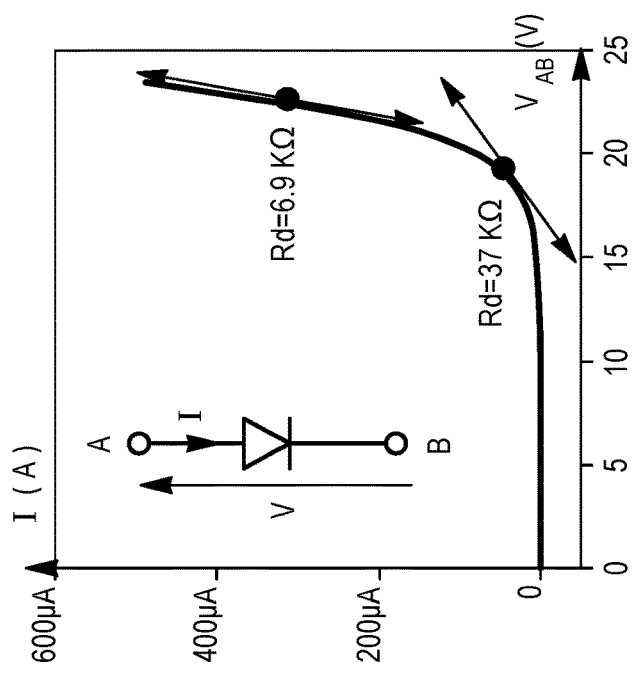
FIG. 10b shows schematically an intensity, volt and value of a dynamic resistance for different polarization points according to the state of the art.

In reference to FIG. 10b, we can see the Intensity-Voltage, between points A and B, characteristic of a dynamic resistance value (inverse of the slope) for different polarization points.

The function having the Intensity (A) in abscissa and the Voltage (V) in ordinates, has the shape of the inverse of a log normal function. So, it shows that the resistance value of $R_D'$, starts to diminish when reaching a given voltage.

To reduce the dynamic resistance $R_D'$, it is therefore important to work with an operating point with the highest possible voltage.

The power line is dimensioned for a characteristic impedance of 50Ω at the target frequency of 1 GHz (the same principle is applicable to other target frequencies beyond 1 GHz for example). So, to ensure continuity of impedance with the excitation source and its connectivity, one should obtain the dynamic resistance as near as possible of 50 Ohm. The voltages must therefore be higher than in the normal operation of a μ-OLED. To reach these high voltages, it is important to ensure that the effective propagation speed of the pulse in the electrode does not break with other parts of the excitation circuit. Indeed, breaking or changing propagation speeds from one element to another causes reflection. Thus, minimizing these reflections allows the energy contained in the pulse to be delivered to the active part of the μ-OLED.

3. Pulse Reflections Issue

The propagation speed Vφ of a wave in a cable is of the order of 180,000 to 200,000 km./s, i.e., considering c, the constant for the speed of light in vacuum: $c/1.7 < V\varphi < c/1.5$.

The propagation speed Vφ is also written as a function of the material and more particularly as a function of the dielectric constant εr of the latter: $V\varphi = c/\sqrt{\varepsilon r}$. In a coaxial cable (type RG 58C/U) the speed is v=200,000 km/s and can also be expressed as a function of the linear capacitance (C~100 pF/m) and the linear inductance (L~250 nH): $V\varphi = \sqrt{(L/C)}$.

The effective propagation speed of a wave in an electrode of coplanar geometry (or ribbon, when the electrodes and ground planes are on the same face of the substrate) depends on the dimensions of this electrode and in particular on the transversal dimension W or L of the track, the thickness of the substrate and the dielectric constant of the latter.

It a priori has a speed different from the speed of propagation in the cable. When a pulse passes from a cable to the electrode of a component, any variation in propagation speed seen by the wave produces a reflection. A part of the wave is indeed reflected because of the break in the spread velocity (or phase velocity in the case of a pulse) between the power cable coming from the generator and the component. This has the effect of reducing the part of the pulse actually delivered to the active part of the component.

The reflections of the pulses can lead to a widening of the pulses, to a dissipation of energy elsewhere than in the organic hetero-structure. These Reflections limit the propagation speed.

One of the most obvious examples relates to the modulation rate when a pulse train is subjected to a μ-OLED which is limited to a period longer than the pulse widening.

Such reflections are well known for electromagnetic waves in the range of optical frequencies (150-250 THz). Thus, at the interface between two materials with index $n_1 = c/v_1$ and $n_2 = c/v_2$, or $v_1$ and $v_2$ are the propagation velocities of the wave in media 1 and 2 respectively, the reflection coefficient formulates as:

$$r = \frac{n1 - n2}{n1 + n2} = \frac{v2 - v1}{v1 + v2}.$$

In the frequency range 100 MHz-10 GHz, the geometries of the electrodes have an influence on the effective propagation velocity and thus create an effective relative dielectric constant εr. There is therefore a way of acting on the geometry to modify the speed of propagation in the electrode. The propagation constant is $$\beta = \frac{\omega}{V\varphi} = \frac{\omega}{C}\sqrt{\varepsilon_r}.$$

Figure 11A:
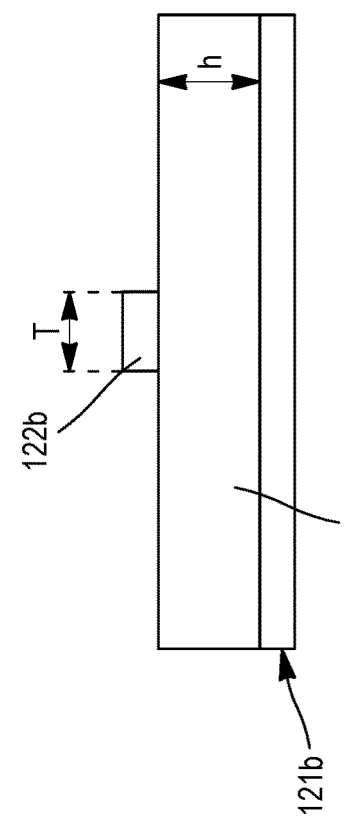
FIGS. 11a, 11b show schematically a vertical section view of respectively a planar geometry and a biplanar geometry of electrodes of a µ-OLED according to the invention.
Figure 11B:
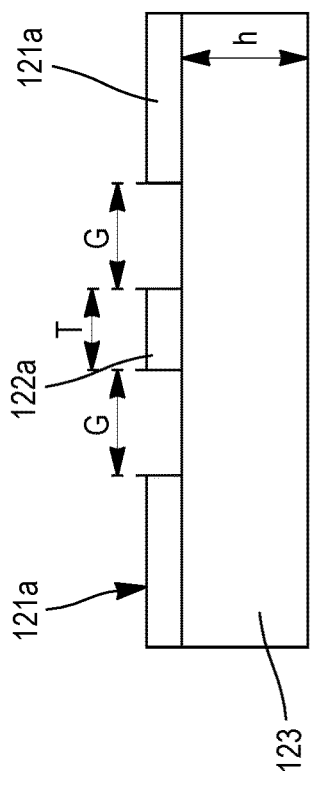

Two types of geometries can be distinguished, allowing the relative effective dielectric permittivity to be modulated:
  Planar geometry wherein an electrode 122a and ground 121a planes are on the same face of a dielectric substrate 123, as illustrated in FIG. 11a.
  Biplanar geometry wherein an electrode 122b is placed on one side of a substrate 123 and a ground plane 121b on the opposite side of the said dielectric substrate 123, as illustrated in FIG. 11b.

The said dielectric substrate 123 contained glass, silicon, silicon oxide, polymers or flexible substrate.

Figure 12A:
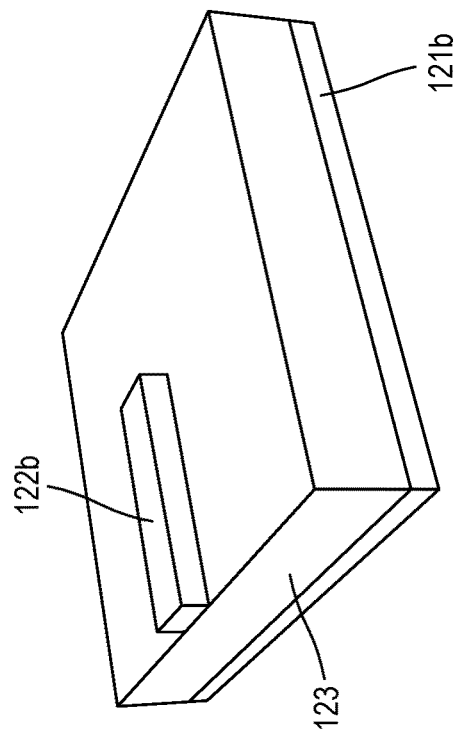
FIGS. 12a, 12b show schematically a perspective view of respectively a planar geometry and a biplanar geometry of electrodes of a µ-OLED according to the invention.

FIG. 12a shows the vertical sectional view of a planar geometry.

Planar electrodes are composed of a central electrode 122a (preferentially an anode) placed equidistantly between two tracks of masses 121a, all arranged in the same plane above a dielectric (preferentially containing glass or silicon) support 123.

h and εr represent respectively the thickness and the relative dielectric permittivity of the dielectric substrate. T and t represent respectively the transversal dimension and thickness of the anode. G is the distance between the anode 122a and ground planes 121a (cathode in some configurations).

These ground planes 121a are present on either side of the anode 122a and are connected to each other either by the external circuit or by the geometry of the electrodes.

For a given dielectric, the characteristic impedance of planar electrodes to produce fast opto-electronic components is given mainly as we will see by the form factor defined by the ratio $$\gamma 1 = \frac{T}{T + 2G}.$$

The following parameters are also defined:

$$\gamma 2 = \frac{\sinh\left(\pi \frac{T}{4h}\right)}{\sinh\left(\pi \frac{T + 2G}{4h}\right)}.$$

The intermediate functions $\beta_1(\gamma)$ and $\beta_2(\gamma)$ defining $\beta(\gamma)$ on different intervals are used:

$$\beta 1(\gamma) = \frac{\pi}{\ln\left(2\frac{1 + \sqrt{\gamma_3}}{1 - \sqrt{\gamma_3}}\right)} \text{ with } \gamma_3 = \sqrt{(1 - \gamma^2)},$$

used for values of γ1 or γ2 in the range $0 < \gamma < 1/\sqrt{(2)}$.

$$\beta 2(\gamma) = \frac{\ln\left(2\frac{1 + \sqrt{\gamma}}{1 - \sqrt{\gamma}}\right)}{\pi}$$

defined for $1/\sqrt{(2)} < \gamma < 1$.

The effective relative permittivity is then given by:

$$\varepsilon r \text{ effective} = 1 + \frac{r-1}{2}\beta(\gamma 2)\beta(\gamma 1),$$

with β=β1 or β2.

Thus, the condition for obtaining the same effective relative dielectric permittivity for the electrodes as for the cables, results in:

$$\varepsilon r \text{ effective} = \varepsilon_r = 1,5.$$

So, we obtained a relation between T, G and the ratio T/(T+2G). To reduce or cancel these reflections, it is therefore possible to modify the geometry of the μ-OLED and in particular the ratio T/(T+2G).

Considering a glass substrate ($\varepsilon_r$=7.75) of thickness H=1000 μm, and tin oxides and indium (ITO) electrodes with a conductivity σ=5.95 $e^5$ of 100 nm thickness.

Given a predefined Transversal dimension T value, we calculate Gap G value such as $\varepsilon_{r\ effective}$=1.5 to obtain the following table of dimensions:

| T | G | T/(T + 2G) |
|---|---|---|
| 100 μm | 30 μm | 0.625 |
| 200 μm | 60 μm | 0.625 |
| 500 μm | 146 μm | 0.631 |
| 1 mm | 267 μm | 0.651 |
| 2 mm | 433 μm | 0.697 |
| 3 mm | 548 μm | 0.732 |
| 4 mm | 640 μm | 0.757 |
| 5 mm | 720 μm | 0.776 |
| 10 mm | 1027 μm | 0.829 |

Figure 13:
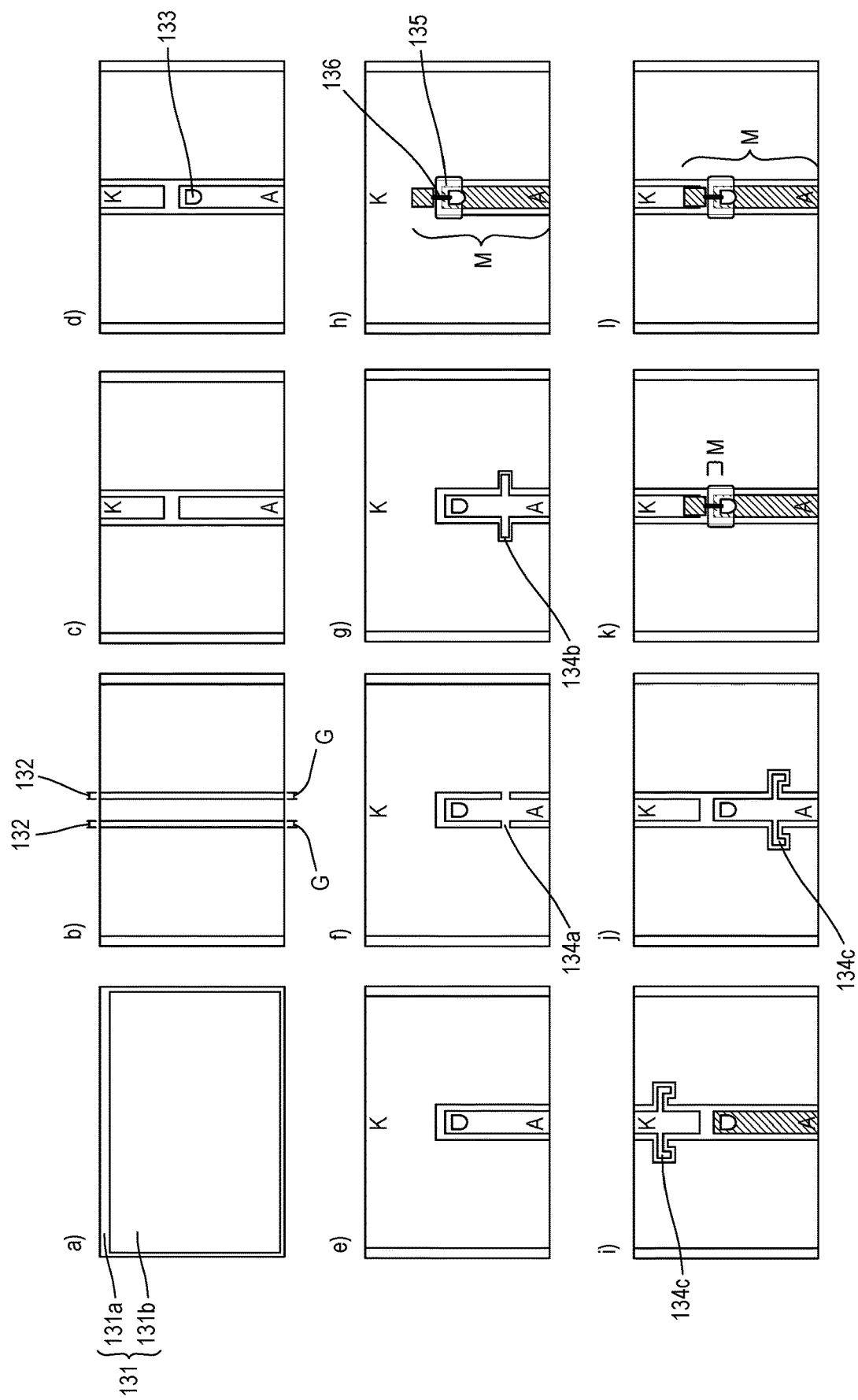
FIG. 13 shows schematically top views structures of coplanar electrodes of a µ-OLED according to the invention.

In reference to FIG. 13, different coplanar electrode structures are illustrated.

An initial dielectric substrate 131, can be a glass sample covered with a conductive layer 131b, for example with ITO (FIG. 13a). Electrodes are structured by removing the conductive layer by at least two parallel continuous lines 132 of transversal dimension G. This allows creating central electrodes of transversal dimension T separated by a distance G from two ground planes (FIG. 13b). This dimensioning makes it possible to ensure continuity of propagation with the excitation source and its connection (the same principle applies to other target frequencies above 1 GHz, for example).

Indeed, the gaps G is dimensioned to adapt the speed of propagation of the electrical pulse in the device for limiting the reflections due to the passage of the electrical impulse between electrical wire and the planar electrode.

Moreover, the gaps G have a size so that an effective dielectric permittivity of the Organic Opto-Electronic device equal to the dielectric permittivity of the electrical wire delivering the electrical impulse (plus or minus 10%).

The electrodes can be arranged according to the configurations of FIG. 13c to allow current measurement by separating the anode (A) and the cathode contact (K) by removing the conducting layer between the electrodes.

Figure 14:
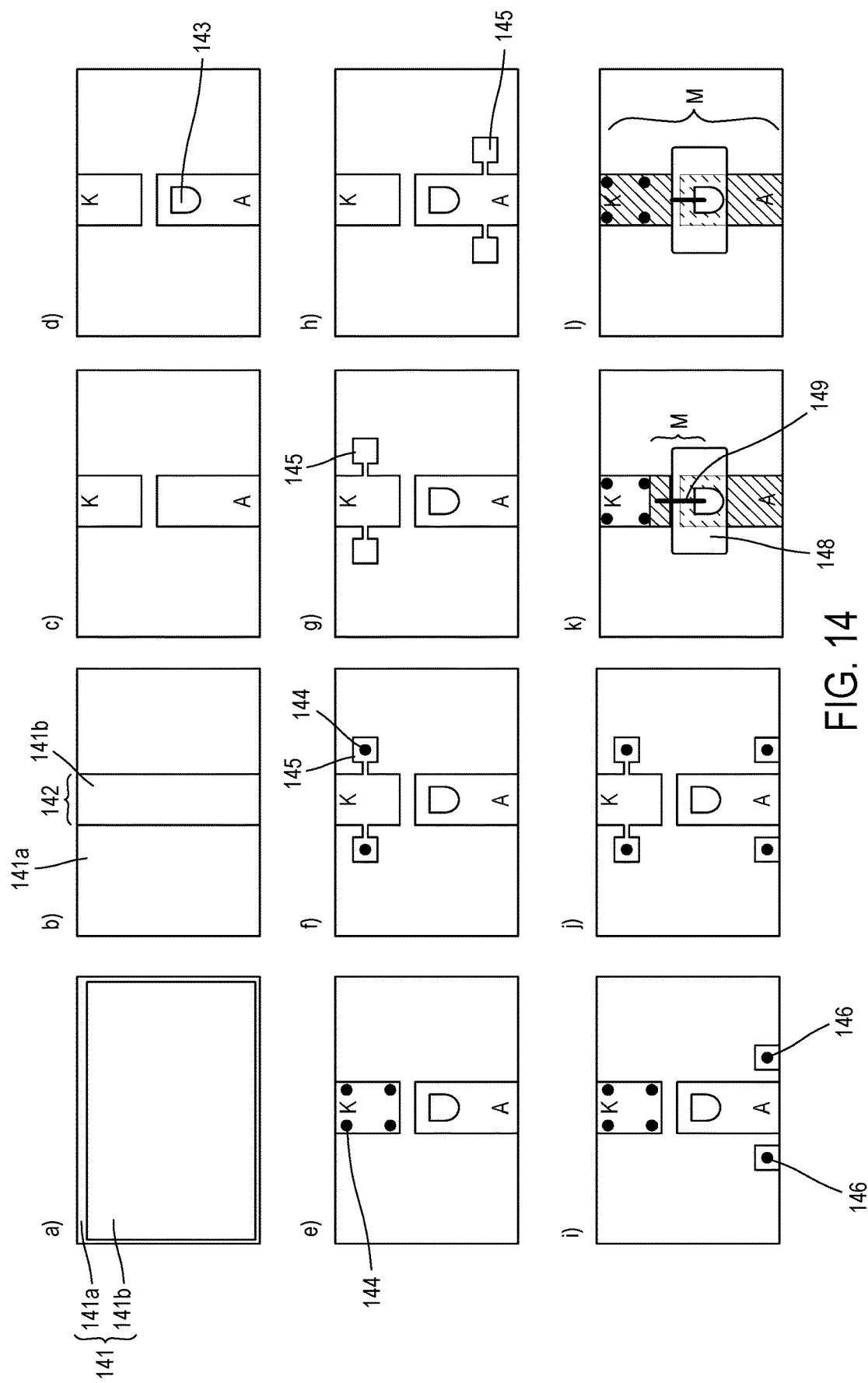
FIG. 14 shows schematically top views structures of planar electrodes of a µ-OLED according to the invention.

The electrode Anode of the FIGS. 13 and 14 corresponds to the electrode 62, 71, 171 of all the FIGS. 6, 7, and 17.

The electrode cathode K of the FIGS. 13 and 14 corresponds to the electrode 63, 73 of all the FIGS. 6, 7, and 17.

The cathode and the anode can obviously be reversed in these figures.

Moreover, as seen previously, by adding a hollow zone 133 (FIG. 13d), it is possible to limit the effects of positional uncertainties on the size of the active surface and thus on the capacitance.

FIGS. 13e to 13h show a structure wherein the cathode K and ground plane are coincident. In this configuration, the conductive layer between the cathode (K) and the ground planes is not removed.

Passive resistances 134a (FIG. 13f) can be created by not completely removing the conductive layer between the ground planes and the cathode (K) or anode (A). Inductors and capacitors 134b can also be engraved on the device in parallel or in series (FIG. 13g) bb being in electrical continuity with the cathode (K) or anode (A).

A complete structure with a metallized anode A allowing a reduction of the series resistance is shown in FIG. 13h.

The structures allowing measurements can integrate passive components 134c at the cathode K (FIG. 13i) or the anode A (FIG. 13j).

The structures finalized with an organic layer 135 and a metallization of the cathode K arm 136 (FIG. 13k) can also integrate an anode A metallization (FIG. 13l).

Figure 12B:
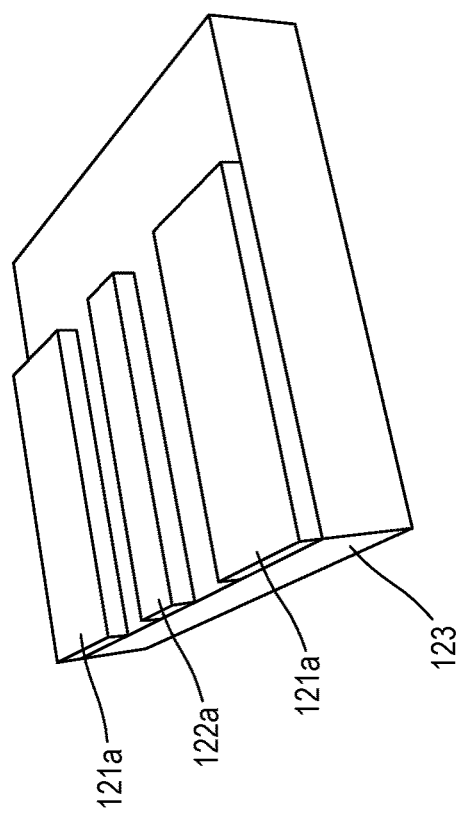

FIG. 12b illustrates another embodiment of electrodes geometry. The said figure shows the vertical sectional view of a bi-planar electrode 122b.

The electrode 122b is placed on one side of a substrate 123 and a ground plane 121b on the opposite side of the said substrate 123.

h and εr respectively represent the thickness and the relative dielectric permittivity of substrate. T and t respectively represent the transversal dimension and thickness of the conductor track.

At a given frequency, the bi-planar electrode is characterized essentially by the form factor W/H. For example, with AN: $\varepsilon_r$=11.9 (Silicon), σ=3.53 $10^7$ (Aluminum) $Z_c$=50Ω, f=1 GHz, H=500 μm, we obtain W=0.803× H=401.6 μm.

In reference to FIG. 14, different biplanar electrode structures are illustrated.

An initial support 141, can contain a silicon sample 141b covered, for example, with ITO (FIG. 14a).

Electrodes are structured in the form of a line 142 (FIG. 14b) dimensioned to reduce the reflection at the interface between the excitation source and its connector.

A cathode K and an anode A are created by separation of the line 142 (FIG. 14c).

A hollow area 143 can be integrated in the anode A (FIG. 14d).

A ground plane on the underside of the support 141 is not illustrated, but the contact with the latter is by vias 144 which may be connections through the substrate 141 (FIG. 14e).

It is possible to add measurement resistances 145 between the cathode K and the ground plane (FIG. 14f), or other passive components 145 at the cathode K (FIG. 14g), or the anode A (FIG. 14h).

Measurement probe is possible by adding contact pads 146 connected to the ground by vias (FIG. 14i), possibly with a measurement resistance 145 between the cathode k and the ground plane (FIG. 14j).

The deposition of the organic layer 148 and the metallization of the cathode K to produce the cathode finger 149 is illustrated in FIG. 14k or FIG. 14l. Metallization of ITO anodes and cathodes may be necessary to reduce the series resistance.

The following table illustrates the different geometries allowing the reduction of the impulsions:

| Substrate | Co-planar electrodes | | | | Bi-planar electrodes | | | |
|---|---|---|---|---|---|---|---|---|
| | h | T | G | Z | h | t | T | Z |
| Glass $\varepsilon_r = 7.75$ | 1100 μm | 1000 μm | 550 μm | 50.0 Ω | 1100 μm | 100 nm (Au) | 1325 μm | 50.0 Ω |
| | 1100 μm | 500 μm | 175 μm | 50.2 Ω | | | | |
| | 1100 μm | 100 μm | 31 μm | 50.2 Ω | | | | |
| | 900 μm | 100 μm | 31 μm | 50.2 Ω | | | | |
| Silicon $\varepsilon_r = 11.9$ | 275 μm | 250 μm | 125 μm | 49.9 Ω | 275 μm | 100 nm (Au) | 219 μm | 50.0 Ω |
| | 275 μm | 500 μm | 195 μm | 50.0 Ω | | | | |
| | 525 μm | 50 μm | 247 μm | 50.0 Ω | 525 μm | 100 nm (Au) | 418 μm | 50.0 Ω |
| | 725 μm | 500 μm | 267 μm | 50.0 Ω | 725 μm | 100 nm (Au) | 577 μm | 50.0 Ω |
| | 725 μm | 1000 μm | 437 μm | 50.0 Ω | | | | |
| Germanium $\varepsilon_r = 16$ | 500 μm | 1000 μm | 525 μm | 50.0 Ω | 500 μm | 100 nm (Au) | 286 μm | 50.0 Ω |
| GaN $\varepsilon_r = 5.35$ | 500 μm | 1000 μm | 130 μm | 50.0 Ω | 500 μm | 100 nm (Au) | 822 μm | |
| Soft subtrate (PET) $\varepsilon_r = 5$ | 500 μm | 1000 μm | 118 μm | 50.0 Ω | | | | |
| | 500 μm | 500 μm | 69 μm | 50.0 Ω | | | | |
| plexiglass $\varepsilon_r = 3.5$ | 500 μm | 242 μm | 20 μm | 50.0 Ω | | | | |

Figure 15:
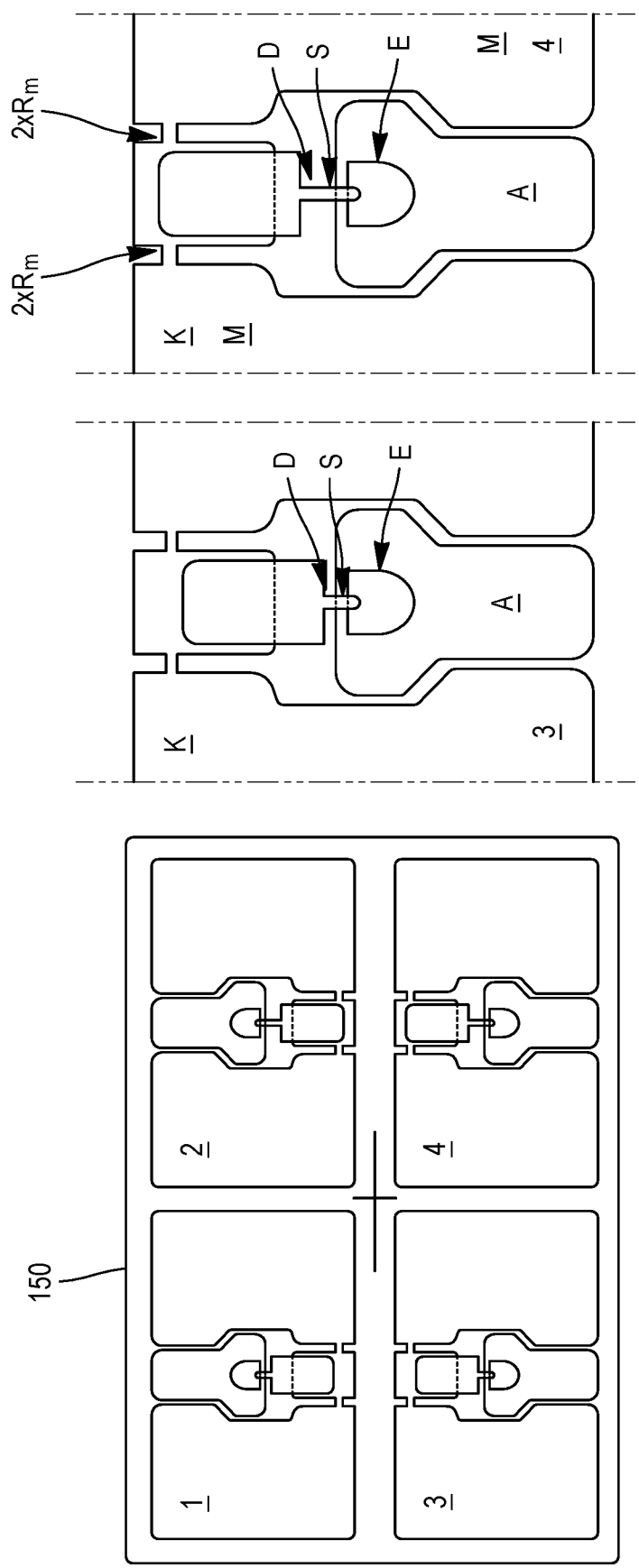
FIG. 15 shows a sample comprising 4 µ-OLED according to the invention.

FIG. 15 shows a sample comprising 4μ-OLED: samples 1 and 3 are in current-measurement configuration (corresponding to FIG. 13.k), samples 2 and 4 are configured in cathode mode connected to the ground plane (corresponding to FIG. 13.h). The glass substrate contains a ITO layer.

The caption in this figure is as follows, A: Anode, K: Cathode, E: Hollow area, S: Active area, D: Metallized cathode fingers, M: ground plane, $R_m$ integrated measuring resistance.

Such configuration allows obtaining:

electrical response times less or equal than about 0.4 ns-1.8 ns; and optical response times less or equal than about 5 ns.

Figure 16:
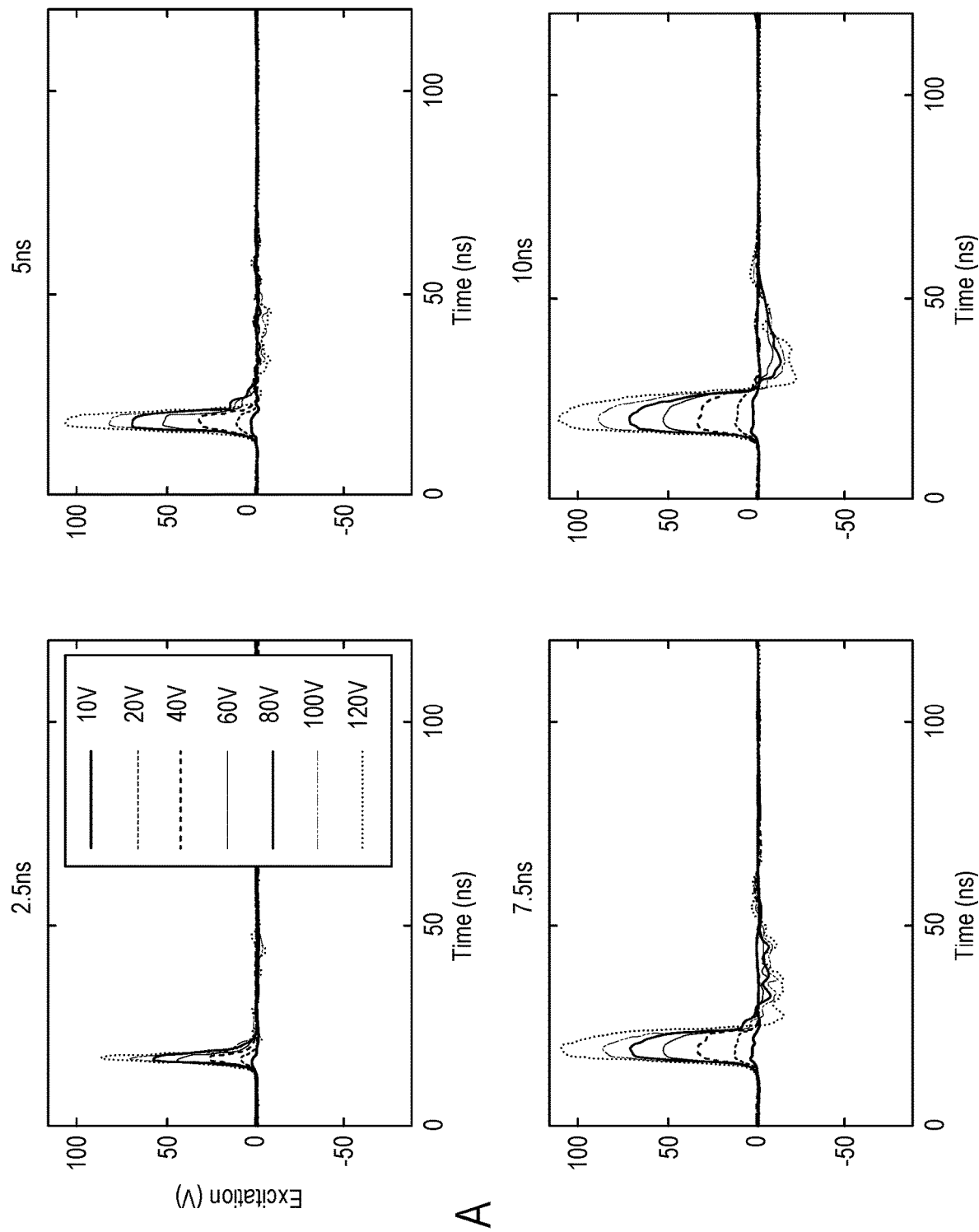
FIGS. 16a, 16b and 16c show respectively the excitation, current density, and luminance time responses of a µ-OLED according to the invention for pulses of 2.5 ns, 5 ns, 7.5 ns and 10 ns.
Figure 16:
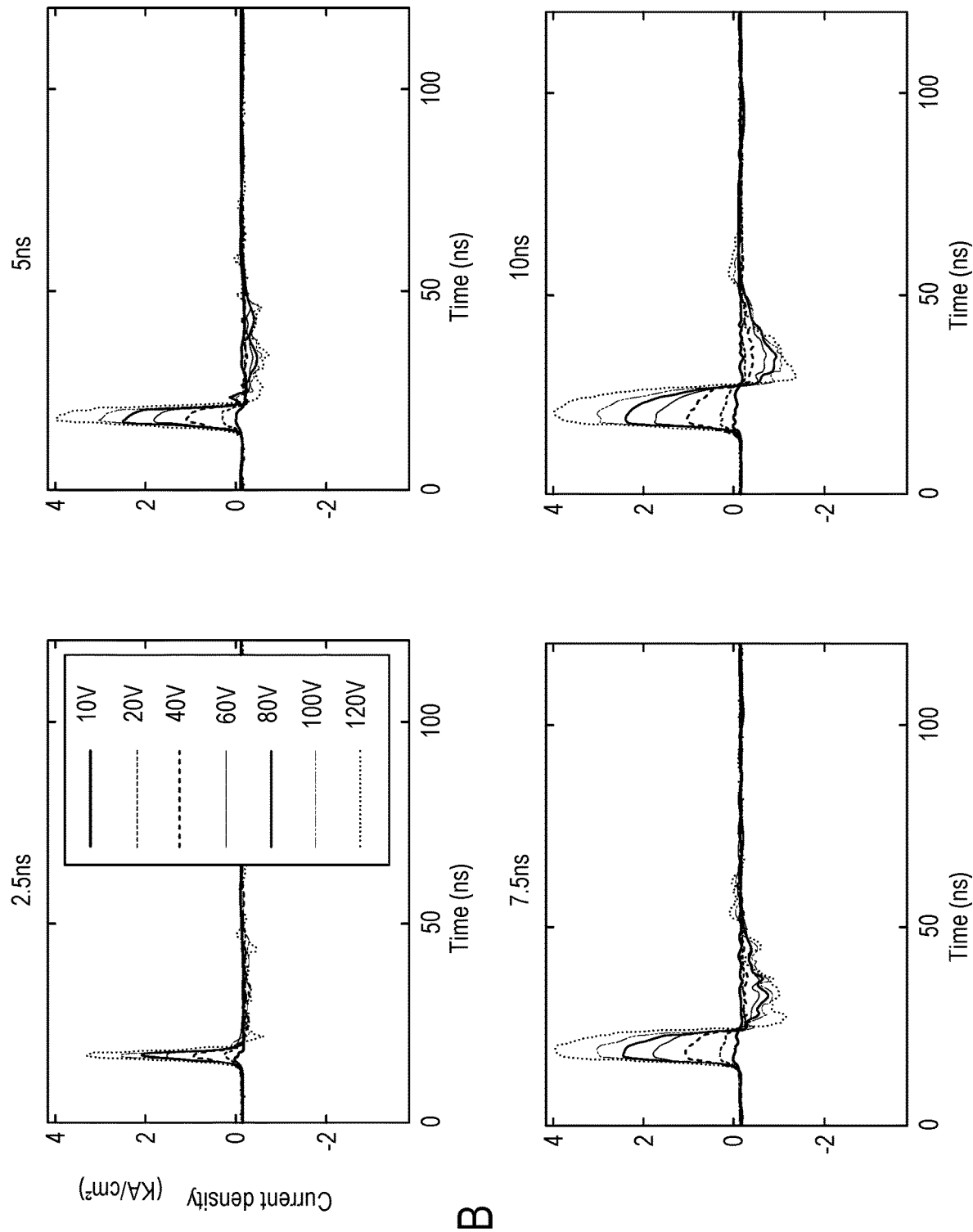
Figure 16:
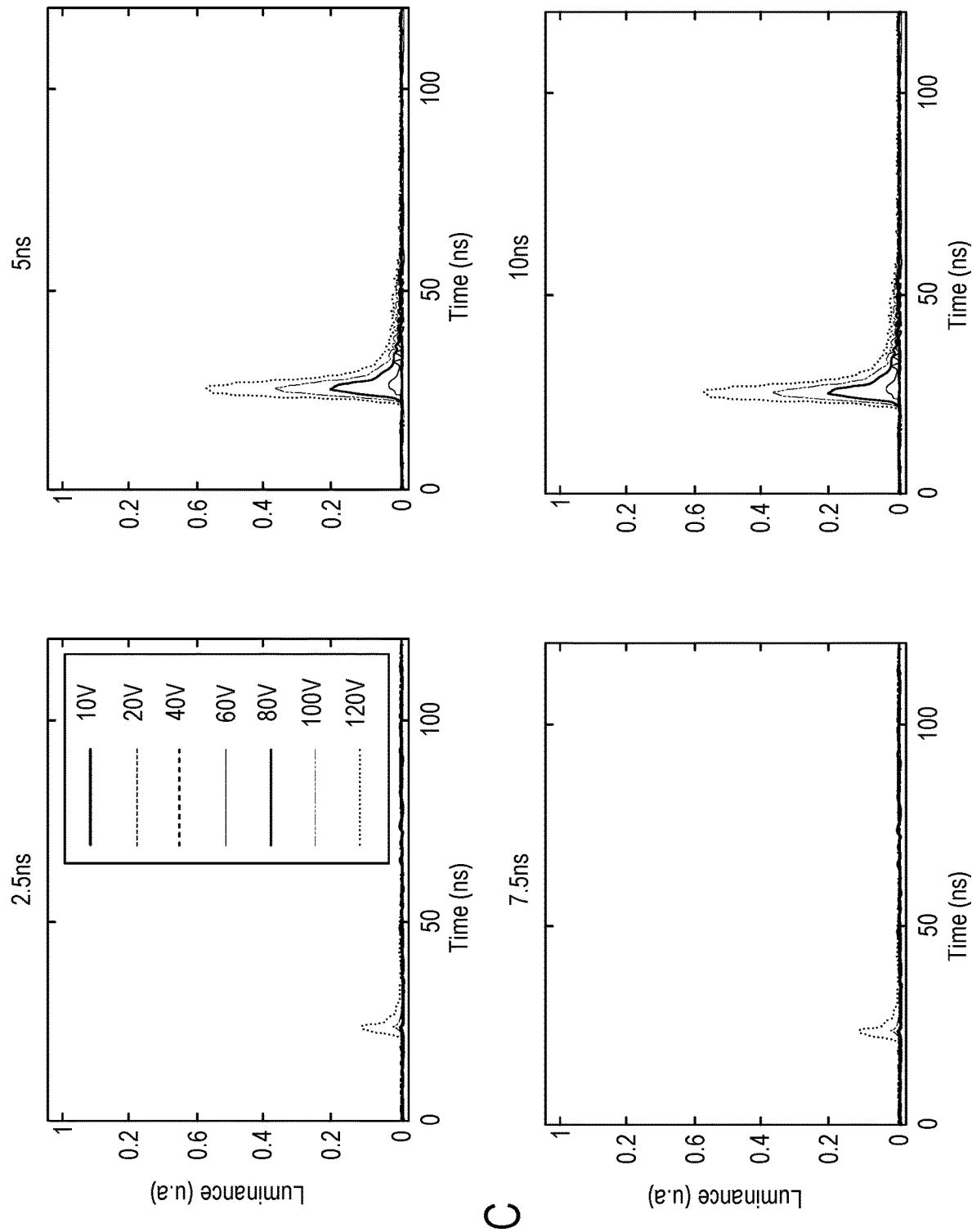

FIG. 16 show electrical and optical time responses of a μ-OLED optimized to reduce parasitic reflections, including an arch geometry, a limitation of the active area to allow a minimization of the capacitance, such as the one shown in FIG. 15.

The electrical and optical time responses are for pulses of 2.5 ns (first column), 5 ns (2nd column), 7.5 ns (3rd column) and 10 ns (4th column).

For each pulse duration, the excitation amplitudes are equal to 10, 20, 40, 60, 80, 100 and 120 volts.

FIG. 16a shows the excitation voltage subject to the μ-OLED, FIG. 16b shows the current density (electrical responses of the μ-OLED), FIG. 16c shows the luminance (UA) (optical responses of the μ-OLED).

The characterization setup consists of a high-speed high-voltage excitation electronic circuit driving the μ-OLED, and a high-speed light collection setup. The excitation circuit also includes a matching resistance equal to 50 ohms to protect the pulse generator, and a serial resistance $R_{MES}=50$ ohms dedicated to the measurement of the instantaneous current I. Devices are driven by a fast pulse generator (AVTech AVL-2A-B) which produces electrical pulses with a transversal dimension varying from 3 ns to 100 ns, 10 Hz repetition rate and an amplitude up to 160V. The excitation pulses have a rise time of 2 ns. The light collection setup includes a confocal microscope for the observation and the detection is performed via an avalanche photodiode (Thorlabs, APD130A). All signals are acquired with a high-speed oscilloscope (Tektronix, TDS7254).

The measurements in FIG. 16 show that:

The response time decreases with the decrease of the active surface of the μ-OLED.

The response time decreases with the decrease of the various resistances:

C=10 pF-20 pF following the samples for a thickness of 100 nm and one Active surface of 100 μm×100 μm.

Rd~120Ω-340Ω.

Rs~60-100Ω (no metallization).

With electrodes optimized to reduce reflections incorporating basket handles, it is possible to achieve current densities of 4000 A/cm².

Thus, the optimized geometry and structure of a μ-OLED as illustrated in FIG. 15, allow obtaining a time response (electrical and optical) below 10 ns, in response to an electrical impulse having a pulse duration time below 100 ns, so as to allow a current density in the active area superior to 3 kA/cm2, preferentially 4 or 5 kA/cm2.

Figure 17A:
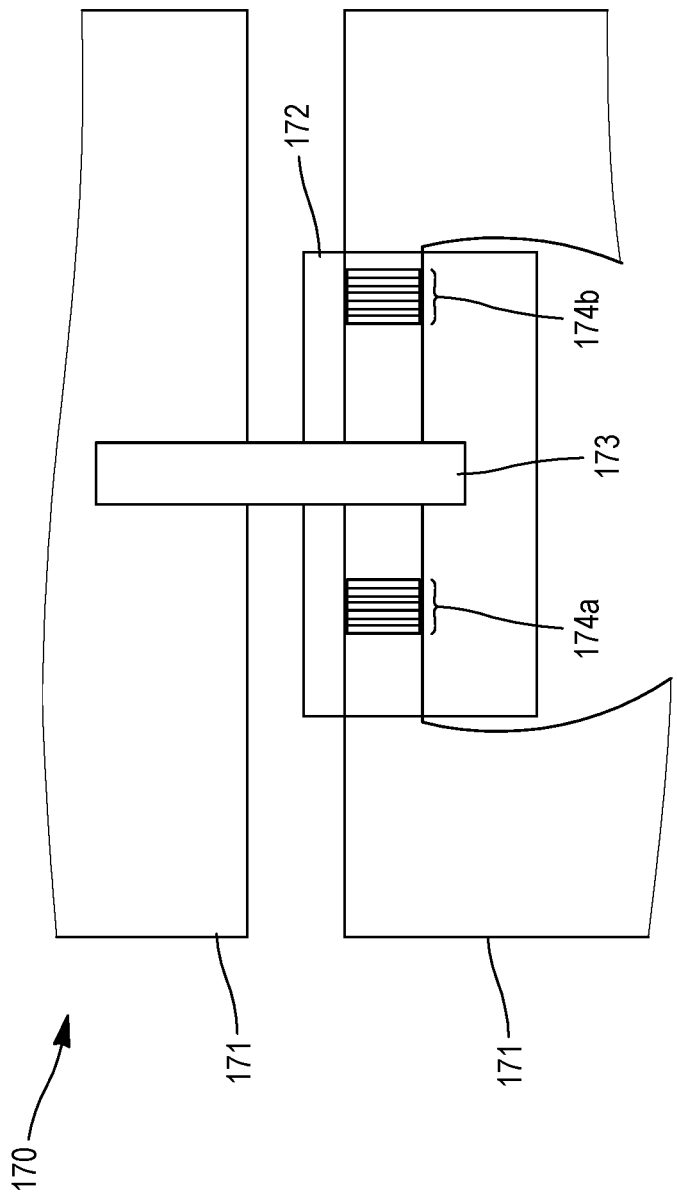
FIGS. 17a and 17b show schematically a top view and a vertical section view of a µ-OLED comprising photonic elements according to the invention.
Figure 17B:
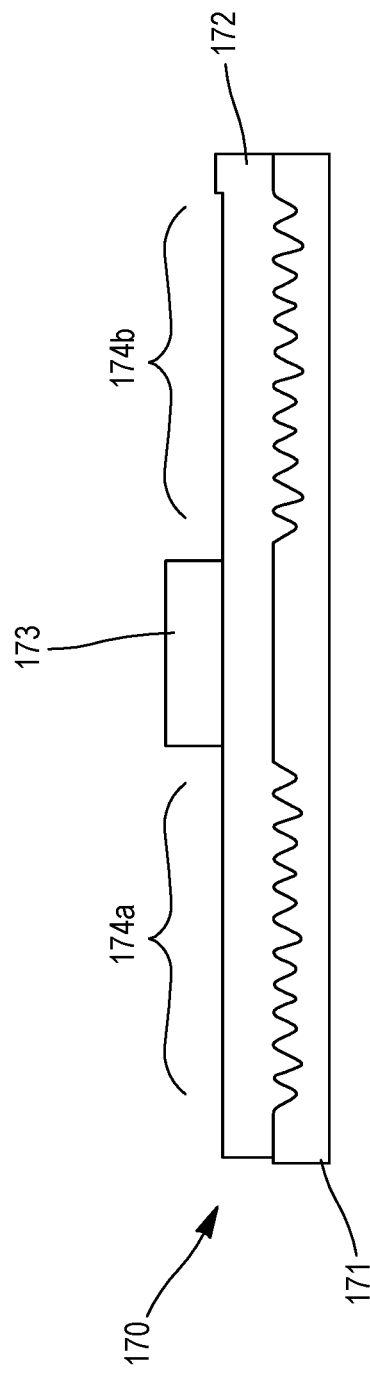

FIGS. 17a and 17b illustrate a μ-OLED 170 with an electrode 171 and an electrode 173.

The branch 171b connecting the two arms 171a can contain one or several photonic elements 174a, 174b.

The photonic elements 174a, 174b can be a waveguide, a grating, Distributed Feedback mirror, a laser cavity, a laser cavity made of distributed feedback mirrors, a photonic crystal, a laser cavity made of a defect in a photonic crystal.

Those photonic elements 174a, 174b allows modifying the emission features, so that we can design μ-OLED 170 with particular optical features.

CITED PRIOR ART

[1]: D. Kasemann, R. Brückner, H. Fröb, and K. Leo, «Organic light-emitting diodes under high currents explored by transient electroluminescence on the nanosecond scale», Phys. Rev. B, vol. 84, no 11, p. 115208, 2011.

[2]: K. Hayashi, H. Nakanotani, M. Inoue, K. Yoshida, O. Mikhnenko, T.-Q. Nguyen, and C. Adachi, «Suppression of roll-off characteristics of organic light-emitting diodes by narrowing current injection/transport area to 50 nm», Applied Physics Letters, vol. 106, no 9, p. 93301, March 2015.

[3] H. Nakanotani, et al "Injection and transport of high current density over 1000 A/cm$^2$ in organic light emitting diodes under pulse excitation", Jpn. J. Appl. Phys. 44 3659 (2005)

[4]: N. C. Giebink et S. R. Forrest, «Temporal response of optically pumped organic semiconductor lasers and its implication for reaching threshold under electrical excitation», Physical Review B, vol. 79, no 7, February 2009.

[5] A. J. Heeger, "Fast pulsed electroluminescence from polymer light-emitting diodes", J. Appl. Phys. Vol. 91, No. 4, 2002.

The invention claimed is:

1. Micro Organic Opto-electronic device emitting a light impulse, in response to an electrical impulse, comprising a dielectric substrate and superposed on the dielectric substrate:
   a first planar electrode with a first extremity;
   an organic layer stack comprising at least one layer of electroluminescent material, at least partially covering the first extremity;
   a second planar electrode, with another extremity covering partially said first extremity and said organic layer stack with a part, defining an active area of the device;
   wherein the position and the geometry of the first extremity is configured so that the first extremity delimits a hollow zone without conductive material, with an arch surrounding the hollow zone;
   the arch having two arms and a branch connecting the two arms;
   the active area been limited by the transversal dimension (Wb) of the said branch and the transversal dimension (W) of the part of the other extremity.

2. Micro Organic opto-electronic device according to claim 1, wherein the hollow zone is configured to cope with a margin of error of the lateral positioning and the longitudinal positioning of the part of the other extremity of the second planar electrode in regard to the first extremity of the first electrode.

3. Micro Organic opto-electronic device according to claim 1, wherein electrical characteristics of the said device are modeled with:
   a resistance Rs;
   a dynamic resistance $R_D$, modelling the diode; and
   at least one junction capacitance in parallel with the dynamical resistance $R_D$, for modelling the active area, wherein the hollow zone is configured to minimize the junction capacitance by reducing the surface of the active area.

4. Micro Organic Opto-Electronic device according to claim 3, configured to minimize the serial resistance Rs, wherein the first planar electrode comprises a metallization layer on its area of the first extremity except on to the active area.

5. Micro Organic opto-electronic device according to claim 1, wherein the longitudinal dimension of the branch is between 2 µm and 20 mm; the longitudinal dimension of the hollow zone is between 2 µm and 20 mm; the transversal dimension of the part of other extremity is between 1 µm and 10 mm, the transversal dimension of the said branch is between 1 µm and 10 mm, and the transversal dimension of the arms are between 1 µm and 1 mm.

6. Micro Organic Opto-Electronic device according to claim 3, wherein:
   the junction capacitance of the active area is less than 200 pF, preferably less than 20 pF and more preferably less than 1 pF;
   the resistance $R_D$ or the dynamic resistance $R_D'$ of the active area is less than 500 Ohms, preferably less than 50 Ohms, and more preferably less than 1 Ohm.

7. Micro Organic Opto-Electronic device according to claim 1, wherein the first planar electrode and/or the second planar electrode presents a transparent and conductive layer.

8. Micro Organic Opto-Electronic device according to claim 1, the part of the first extremity is rectilinear, and is perpendicular to the branch.

9. Micro Organic Opto-Electronic device according to claim 1, wherein the Opto-Electronic device is an OLED or an Organic photodiode.

10. Micro Organic Opto-Electronic device according to claim 1, wherein the hollow zone present rounded inner corners.

11. Micro Organic Opto-Electronic device according to claim 1, wherein the first planar electrode and/or the second planar electrode presents a conductive and transparent oxide layer or a metallic layer, configured for letting the light pass through or for waveguiding of light.

12. Micro Organic Opto-Electronic device according to claim 1, wherein the first planar electrode comprises a metallization layer on its area of the first extremity except on to the active area.

13. Micro Organic Opto-Electronic device according to claim 1, wherein the first planar electrode is the cathode formed with an ITO (indium Tin Oxide) layer, and the second planar electrode is the anode and presents a metallic layer.

14. Micro Organic Opto-Electronic device according to claim 1, wherein the organic layers stack presents an M-mt-DATA type material.

15. Micro Organic Opto-Electronic device according to claim 1, wherein the thickness of the organic layer stack is between 50 nm and 200 nm.

16. Micro Organic Opto-Electronic device according to claim 1, wherein the active area has a maximum dimension less than 500×500 micrometers squared, more preferably less than 100 micrometers squared and even more preferably less than 20 micrometers squared.

17. Micro Organic Opto-Electronic device according to claim 1, wherein the said micro Organic Opto-Electronic device is configured to have a time response below 10 ns, in response to an electrical impulse having a pulse duration time below 100 ns, advantageously below 10 ns, so as to allow a current density in the active area superior to 3 kA/cm$^2$,
   the micro Organic Opto-Electronic device modeled by a junction capacitance and a serial resistance Rs and a dynamic resistance Rd, allows having a response below 10 ns by:
   minimizing the junction capacitance by reducing the surface of the active area;
   the minimization of the serial resistance Rs and the dynamic resistance $R_D$;
   and wherein:
   the dielectric substrate supports at least one ground plane;
   some electrical wires for the voltage supply are connected to the first planar electrode and to the second planar electrode;

the first planar electrode, the second planar electrode and the ground plane are separated by gaps without conductive material; and the gaps having a size so that an effective dielectric permittivity of the Organic Opto-Electronic device equal to the dielectric permittivity of the electrical wire delivering the electrical impulse.

18. Micro Organic Opto-Electronic device according to claim 17, wherein the first planar electrode, the second planar electrode and the ground plane are structured to integrate an excitation or a characterization circuit, including at least a resistance, capacitance and/or inductance.

19. Micro Organic Opto-Electronic device according to claim 1, wherein the branch connecting the two arms comprises one or several photonic elements.

20. Micro Organic Opto-Electronic device according to claim 19, wherein the photonic element is chosen among the list: a waveguide, a grating, a Distributed Feedback mirror, a laser cavity, a laser cavity made of distributed feedback mirrors, a photonic crystal, a laser cavity made of a defect in a photonic crystal.

* * * * *